(12) United States Patent
Suzuki

(10) Patent No.: US 11,027,395 B2
(45) Date of Patent: Jun. 8, 2021

(54) POLISHING APPARATUS, POLISHING METHOD, AND MACHINE LEARNING APPARATUS

(71) Applicant: Ebara Corporation, Tokyo (JP)

(72) Inventor: Yuta Suzuki, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 16/579,296

(22) Filed: Sep. 23, 2019

(65) Prior Publication Data
US 2020/0101579 A1  Apr. 2, 2020

(30) Foreign Application Priority Data

Sep. 27, 2018 (JP) .............................. JP2018-181352

(51) Int. Cl.
*B24B 51/00* (2006.01)
*H01L 21/306* (2006.01)
*H01L 21/66* (2006.01)
*G06N 3/08* (2006.01)
*G06N 3/04* (2006.01)

(52) U.S. Cl.
CPC ............... *B24B 51/00* (2013.01); *G06N 3/04* (2013.01); *G06N 3/08* (2013.01); *H01L 21/30625* (2013.01); *H01L 22/26* (2013.01)

(58) Field of Classification Search
None
See application file for complete search history.

(56) References Cited

U.S. PATENT DOCUMENTS

| 2015/0147829 A1* | 5/2015 | Benvegnu | H01L 22/12 438/8 |
| 2018/0093360 A1 | 4/2018 | Shinozaki et al. | |
| 2018/0150052 A1* | 5/2018 | Cherian | G05B 19/406 |
| 2018/0304435 A1* | 10/2018 | Xu | G06N 3/08 |
| 2019/0240799 A1* | 8/2019 | Takeda | B24B 49/04 |
| 2019/0283209 A1* | 9/2019 | Osterheld | B24B 37/04 |
| 2019/0299356 A1* | 10/2019 | Xu | B24B 49/105 |

FOREIGN PATENT DOCUMENTS

JP  2012-135865 A  7/2012

\* cited by examiner

*Primary Examiner* — Angel Roman
(74) *Attorney, Agent, or Firm* — Leydig, Voit & Mayer, Ltd.

(57) ABSTRACT

A polishing unit 3A includes a state acquisition section 846 and a learning section. The state acquisition section can acquire a state variable including at least one of data on a state of a top ring making up the polishing unit and data on a state of a semiconductor wafer. The learning section has learned a relationship between the state variable and a change in film thickness of the semiconductor wafer using a neural network, the learning section being capable of receiving the state variable from the state acquisition section to predict the change and/or receiving the state variable from the state acquisition section to determine that the change is abnormal.

7 Claims, 15 Drawing Sheets

POLISHING APPARATUS, POLISHING METHOD, AND MACHINE LEARNING APPARATUS

TECHNICAL FIELD

The present invention relates to a polishing apparatus, a polishing method, and a machine learning apparatus.

BACKGROUND ART

In recent years, with the progress of the higher integration of semiconductor devices, circuit wiring is becoming finer, and an inter-wiring distance is becoming narrower. Therefore, it has been necessary to flatten the surface of the semiconductor wafer as a target, and polishing has been performed by a chemical mechanical polishing (CMP) device as such a means of flattening the surface of the semiconductor wafer.

A polishing apparatus includes a rotational table for holding a polishing pad to polish a target, and a top ring for pressing the target against the polishing pad while holding the target. Each of the rotational table and the top ring is rotationally driven by a drive section (for example, a motor). A liquid containing polishing agent (slurry) is made to flow on the polishing pad, and the target held by the top ring is pressed against the polishing pad, whereby the target is polished.

In the polishing apparatus, when the target is insufficiently polished, the insulation between circuits cannot be secured, and thus short-circuiting may occur. Furthermore, when the target is over-polished, there occurs such a problem that the resistance value of a wire increases due to reduction of the cross-sectional area of the wire, or a wire itself is completely removed, and thus a circuit itself is not formed. In addition, it is necessary to flatten the entire surface with high accuracy. Therefore, it is required in the polishing apparatus to detect a proper polishing end point and also detect a polishing amount over the entire surface with high accuracy.

An eddy current type end point detection sensor (hereinafter referred to as "eddy current sensor") disclosed in Japanese Patent Laid-Open No. 2012-135865, etc. are known as techniques for satisfying the foregoing requirement. In the eddy current sensor described above, eddy current in a target is detected by a solenoid type or spiral type coil. Variation of the film thickness of the target increases or decreases eddy current.

As other methods for the polishing end point detection means are known a method of detecting variation of polishing frictional force when the film thickness of the target varies and thus polishing shifts to a material having different quality of material. The variation of the polishing frictional force is reflected as the variation of the motor current value of the above-described drive section, and therefore the film thickness of the target can be detected by a motor current sensor. As the above-described methods are also known a method of detecting variation of reflectivity of the surface of the target using an optical sensor.

Outputs of these sensors for measuring the film thickness of the target during polishing are subjected to processing such as averaging processing of the output of the sensor and noise filter processing for noise removal and/or amplification processing. These processing operations are performed by a processing system based on an analog circuit or a digital circuit (software or the like). When these processing operations are complicated, a delay (time lag) occurs between the measurement time by a sensor and the processing end time.

For these processing operations, data transmission/reception may be performed in a communication system within the polishing apparatus or in a communication system between the polishing apparatus and another polishing apparatus. A delay caused by a communication system for data transmission/reception may occur. As a result, the polishing apparatus cannot completely perform end point detection and grasp film thickness data used for various controls on a real-time basis. Since polishing is progressing even during execution of the processing by the processing system or the communication system which is based on an analog circuit or a digital circuit, an error occurs between the film thickness grasped at the end time of the processing by the processing system or the communication system and the actual film thickness at the end time of the processing.

With the progress of the miniaturization of semiconductor devices, the required polishing amount decreases and the polishing time is also shortened, whereas a requirement for enhancing the measurement accuracy of the film thickness is more and more increased. Therefore, the influence of a time delay on the film thickness grasped by the processing system or the communication system increases in connection with a processing delay of the processing system or the communication system.

Variation of the film thickness is detected by the film thickness sensors such as the eddy current sensor, the motor current sensor, and the optical sensor that are described above, but it is necessary to enhance the measurement accuracy itself of the film thickness by these sensors.

An exemplary embodiment of the present invention has been made to solve such a problem, and has an object to provide a polishing apparatus, a polishing method and a machine learning apparatus in which the measurement accuracy is improved.

CITATION LIST

Patent Literature

PTL 1: Japanese Patent Laid-Open No. 2012-135865

SUMMARY

In order to attain the above-described object, a first aspect adopts a configuration of a polishing apparatus capable of polishing a target, the polishing apparatus including a state acquisition section capable of acquiring a state variable including at least one of data on a state of a device making up the polishing apparatus and data on a state of the target, and a learning section that has learned a relationship between the state variable and a change in film thickness of the target using a neural network, the learning section being capable of receiving the state variable from the state acquisition section to predict the change and/or receiving the state variable from the state acquisition section to determine that the change is abnormal.

A second aspect adopts a configuration of the polishing apparatus according to the first aspect, in which the data on the state of a device making up the polishing apparatus includes at least one of data on the arrangement of the device, data on an operation state of the device, and data on the state of exhaustion of the device, and the data on a state of the target includes at least one of data detected by a film thickness detection section capable of detecting a film thickness of the target, data detected by a temperature detection section capable of detecting a temperature of the target, data detected by a pressure detection section capable of detecting a pressure applied to the target, and data on characteristics of the target.

A third aspect adopts a configuration of the polishing apparatus according to the second aspect, in which the data on the arrangement of the device includes at least one of data on the position of the top ring capable of holding the target, data on the position of the rotational table capable of rotating the polishing pad to polish the target, data on the position of the arm holding the top ring, and data on the position of the dresser capable of performing dressing the polishing pad, and the data on the operation state of the device includes at least one of data on the number of revolutions of the top ring, and data on the number of revolutions of the rotational table, data on a state of exhaustion of the device includes at least one of data on a use time of a consumable part included in the polishing apparatus, and data on a consumed amount of the consumable part, and the data on characteristics of the target includes at least one of data on a material of the target, and data on a film thickness and a circuit pattern on the target before being polished by the polishing apparatus.

A fourth aspect adopts a configuration of the polishing apparatus according any one of the first to third aspects, the polishing apparatus further including a determination data acquisition section that acquires determination data indicating presence or absence of abnormality, or degree of abnormality of the polishing apparatus, in which the learning section learns a change in film thickness of the target based on a dataset created based on a combination of the state variable and the determination data.

A fifth aspect adopts a configuration of the polishing apparatus according any one of the first to fourth aspects, in which the learning section receives the state variable from the state acquisition section to learn the change.

A sixth aspect adopts a configuration of a polishing method causing a computer to execute a state acquiring step of acquiring a state variable including at least one of data on a state of a device making up the polishing apparatus and data on a state of the target, and an estimating step of causing a learning section that has learned a relationship between the state variable and a change in film thickness of the target using a neural network to receive the acquired state variable to predict the change and/or to receive the acquired state variable to determine that the change is abnormal.

A seventh aspect adopts a configuration of a machine learning apparatus capable of learning a change in film thickness of a target to be polished by a polishing apparatus, the machine learning apparatus including a state acquisition section capable of acquiring a state variable including at least one of data on a state of a device making up the polishing apparatus and data on a state of the target, and a learning section that has learned a relationship between the state variable and a change in film thickness of the target using a neural network, the learning section being capable of receiving the state variable from the state acquisition section to predict the change and/or receiving the state variable from the state acquisition section to determine that the change is abnormal.

An eighth aspect adopts a configuration of a machine learning apparatus capable of learning a change in film thickness of a target to be polished by a polishing apparatus, the machine learning apparatus including a state acquisition section capable of acquiring a state variable including at least one of data on a state of a device making up the polishing apparatus and data on a state of the target, and a learning section capable of learning a relationship between the state variable and a change in film thickness of the target using a neural network, and receiving the state variable from the state acquisition section to predict the change and/or receiving the state variable from the state acquisition section to determine that the change is abnormal.

A ninth aspect adopts a configuration of a computer readable recording medium recording a program for causing a computer controlling a polishing apparatus capable of polishing a target to execute the steps of acquiring a state variable including at least one of data on a state of a device making up the polishing apparatus and data on a state of the target, generating at least one amount of feature using a neutral network, the neutral network including a plurality of input nodes in which the state variable is input, an output node from which the amount of feature is output, and a plurality of hidden nodes connecting the input node and the output node, and controlling the polishing apparatus based on the amount of feature.

The amount of feature is data to be output by a learning section, and, for example, is data indicating the predicted change in the film thickness and/or data indicating a determination result of whether the change is abnormal.

DESCRIPTION OF EMBODIMENTS

Hereinafter, embodiments of the present invention will be described with reference to drawings. Note that in each embodiment described hereinafter, identical or corresponding members are given the same symbols, and duplicative description may be omitted. The features shown in each embodiment may be applied to the other embodiments as long as these features do not contradict one another.

Figure 1:
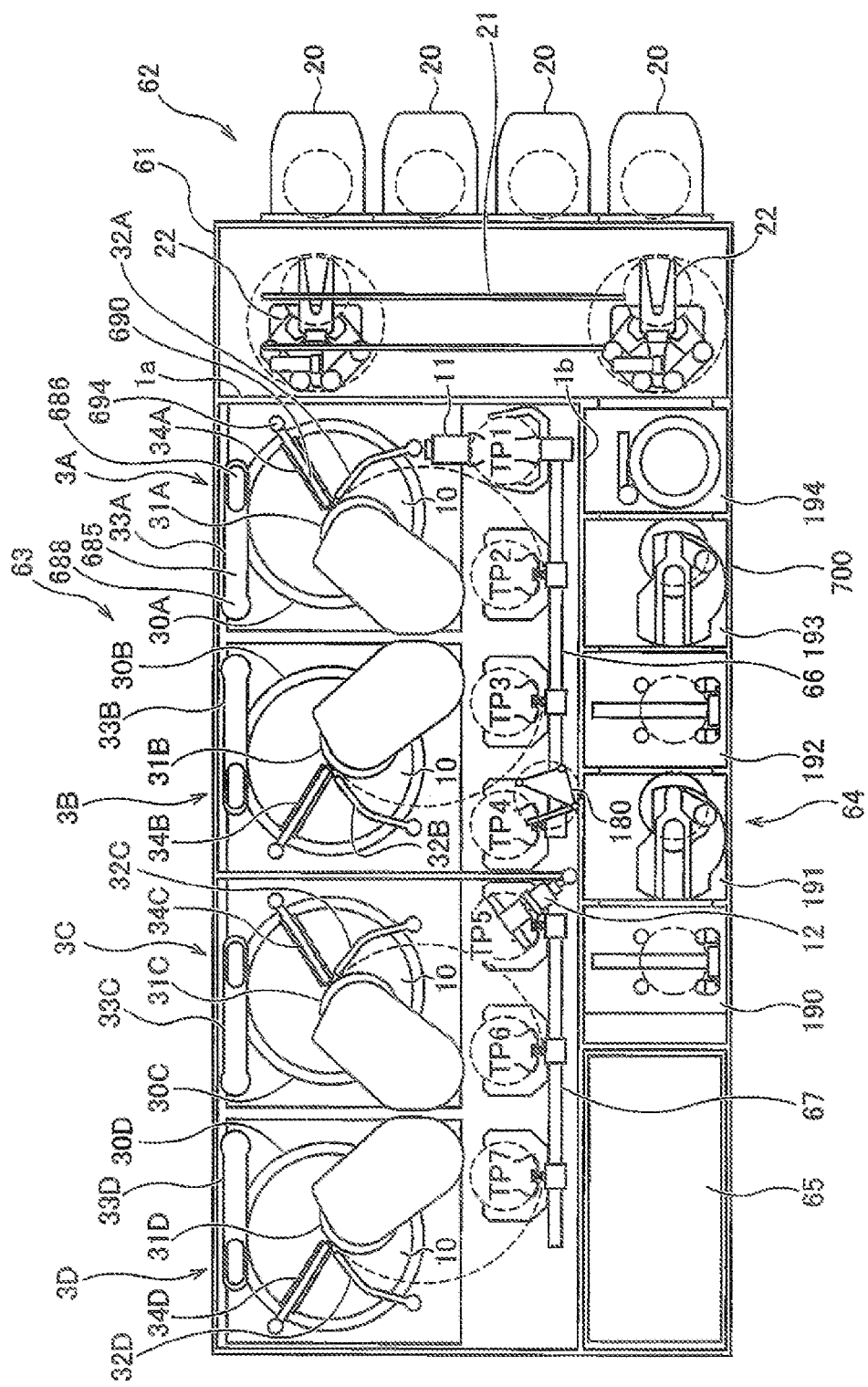
FIG. 1 is a plan view illustrating an overall configuration of a substrate processing apparatus according to one embodiment of the present invention.

FIG. 1 is a plan view illustrating an overall configuration of a substrate processing apparatus according to one embodiment of the present invention. As illustrated in FIG. 1, the substrate processing apparatus includes a casing, that is, a housing 61 having a substantially rectangular shape in the present embodiment. The housing 61 includes a side wall 700. The inside of the housing 61 is partitioned into a load/unload section 62, a polishing section 63, and a cleaning section 64 by partition walls 1a and 1b. Each of the load/unload section 62, the polishing section 63 and the cleaning section 64 is independently assembled and independently evacuated. Furthermore, the substrate processing apparatus also includes a control section 65 that controls a substrate processing operation.

The load/unload section 62 includes two or more (four in the present embodiment) front load units 20, in each of which a wafer cassette where many semiconductor wafers (substrates) are stocked is mounted. The front load units 20 are disposed adjacent to the housing 61 and arranged along a width direction (a direction perpendicular to a longitudinal direction) of the substrate processing apparatus. Each front load unit 20 is configured to mount an open cassette, a SMIF (Standard Manufacturing Interface) pod, or a FOUP (Front Opening Unified Pod) thereon. Here, each of the SMIF and the FOUP is a hermetically sealed container that accommodates a wafer cassette therein and is covered with the partition walls so as to keep an independent environment isolated from an external space.

A traveling mechanism 21 is laid along the arrangement of the front load units 20 in the load/unload section 62. Two transport robots (loaders) 22 are installed on the traveling mechanism 21 to be movable along the direction of the arrangement of the wafer cassettes. The transport robots 22 can access the wafer cassettes mounted in the front load units 20 by moving on the traveling mechanism 21. Each transport robot 22 has two upper and lower hands. The upper hand is used to return the processed semiconductor wafer to a wafer cassette. The lower hand is used to unload a semiconductor wafer before processing from the wafer cassette. In this way, the upper hand and the lower hand are used for different purposes. Furthermore, the semiconductor wafer can be turned over by causing the lower hand of the transport robot 22 to turn around its shaft center.

The load/unload section 62 is a region which needs to be kept in the cleanest state. Therefore, the interior of the load/unload section 62 is always kept at a pressure higher than that in any of the outside of the substrate processing apparatus, the polishing section 63, and the cleaning section 64. The polishing section 63 is the dirtiest region because the slurry is used as a polishing liquid. Accordingly, a negative pressure is formed inside the polishing section 63 and is kept lower than the pressure inside the cleaning section 64. A filter fan unit (not illustrated) having a clean air filter such as a HEPA filter, a ULPA filter, or a chemical filter is provided in the load/unload section 62. Clean air from which particles, toxic vapor, or toxic gas has been removed is always blown out from the filter fan unit.

The polishing section 63 is a region where polishing (flattening) of a semiconductor wafer is performed, and includes a first polishing unit 3A, a second polishing unit 3B, a third polishing unit 3C, and a fourth polishing unit 3D. As illustrated in FIG. 1, the first polishing unit 3A, the second polishing unit 3B, the third polishing unit 3C, and the fourth polishing unit 3D are arranged along the longitudinal direction of the substrate processing apparatus.

As illustrated in FIG. 1, the first polishing unit 3A includes a rotational table 30A, a top ring 31A, a polishing liquid supply nozzle 32A, a dresser 33A, and an atomizer 34A. A polishing pad 10 having a polishing surface is attached to the rotational table 30A. The top ring (holding section) 31A holds a semiconductor wafer and polishes the semiconductor wafer while pressing the semiconductor wafer against the polishing pad 10 on the rotational table 30A. The polishing liquid supply nozzle 32A supplies a polishing liquid or a dressing liquid (for example, deionized water) to the polishing pad 10. The dresser 33A performs a dressing of the polishing surface of the polishing pad 10. The atomizer 34A ejects a mixed fluid of a liquid (for example, deionized water) and gas (for example, nitrogen gas) or a mist form of a liquid (for example, deionized water) to the polishing surface.

Likewise, the second polishing unit 3B includes a rotational table 30B to which a polishing pad 10 is attached, a top ring 31B, a polishing liquid supply nozzle 32B, a dresser 33B, and an atomizer 34B. The third polishing unit 3C includes a rotational table 30C to which a polishing pad 10 is attached, a top ring 31C, a polishing liquid supply nozzle 32C, a dresser 33C, and an atomizer 34C. The fourth polishing unit 3D includes a rotational table 30D to which a polishing pad 10 is attached, a top ring 31D, a polishing liquid supply nozzle 32D, a dresser 33D, and an atomizer 34D.

The first polishing unit 3A, the second polishing unit 3B, the third polishing unit 3C, and the fourth polishing unit 3D have the same configuration as each other. Therefore, for the details of the polishing unit, the first polishing unit 3A will be described below.

Figure 2:
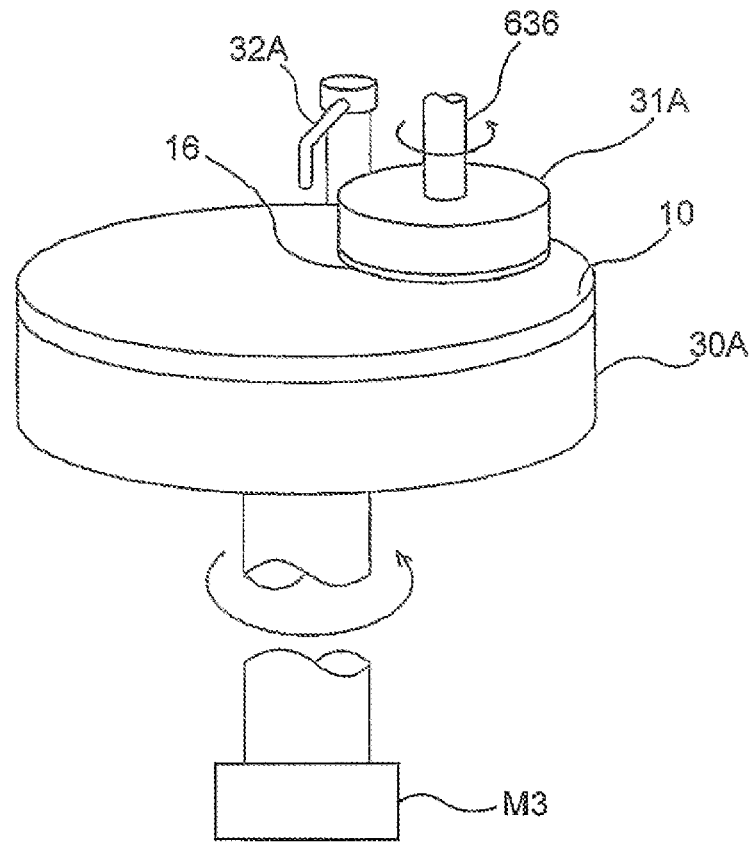
FIG. 2 is a perspective view schematically illustrating a first polishing unit.

FIG. 2 is a perspective view schematically illustrating the first polishing unit 3A. The top ring 31A is supported on a top ring shaft 636. The polishing pad 10 adheres to the top surface of the rotational table 30, and the top surface of the polishing pad 10 constitutes the polishing surface for polishing a semiconductor wafer 16. Note that instead of the polishing pad 10, fixed abrasive grains may be also used. The top ring 31A and the rotational table 30A are configured to rotate around their shaft centers as indicated by the arrows. The semiconductor wafer 16 is held on a bottom surface of the top ring 31A by vacuum suction. During polishing, a polishing liquid is supplied to the polishing surface of the polishing pad 10 from the polishing liquid supply nozzle 32A, and the semiconductor wafer 16, which is a target, is pressed against the polishing surface by the top ring 31A, thus being polished.

Figure 3:
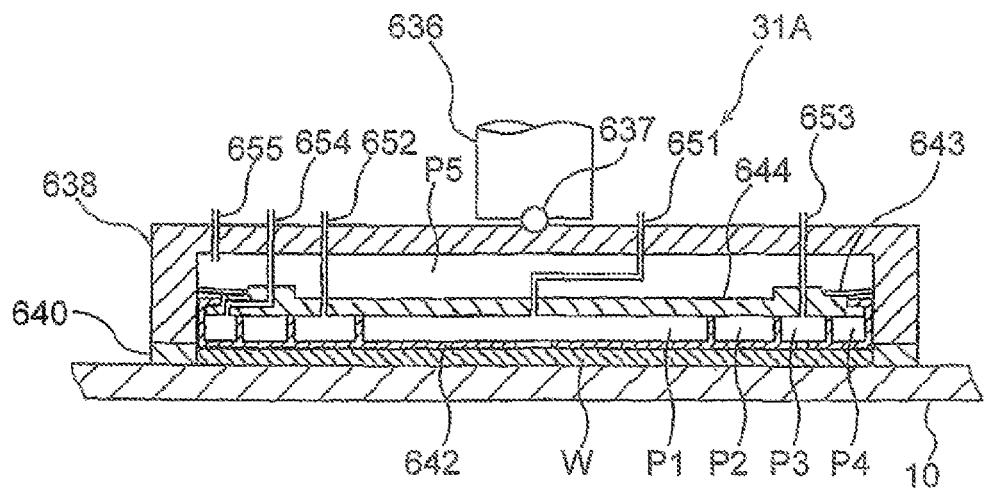
FIG. 3 is a cross-sectional view schematically illustrating a structure of a top ring.

FIG. 3 is a cross-sectional view schematically illustrating a structure of the top ring 31A. The top ring 31A is connected to a lower end of the top ring shaft 636 via a universal joint 637. The universal joint 637 is a ball joint that transmits rotation of the top ring shaft 636 to the top ring 31A while allowing relative tilting between the top ring 31A and the top ring shaft 636. The top ring 31A includes a top ring main body 638 in a substantially circular disk shape and a retainer ring 640 arranged on the bottom of the top ring main body 638. The top ring main body 638 is formed of a material high in strength and rigidity such as a metal or ceramics. The retainer ring 640 is formed of a resin material high in rigidity or ceramics and the like. The retainer ring 640 may be formed integrally with the top ring main body 638.

A circular elastic pad 642 that abuts on the semiconductor wafer 16, an annular pressure sheet 643 composed of an elastic film, and a schematically disk-shaped chucking plate 644 that holds the elastic pad 642 are accommodated in a space formed inside the top ring main body 638 and the retainer ring 640. An upper peripheral end of the elastic pad 642 is held in the chucking plate 644, and four pressure chambers (air bags) P1, P2, P3, and P4 are provided between the elastic pad 642 and the chucking plate 644. The pressure chambers P1, P2, P3, and P4 are formed of the elastic pad 642 and the chucking plate 644. A pressurized fluid such as pressurized air is supplied to the pressure chambers P1, P2, P3, and P4 via respective fluid paths 651, 652, 653, and 654, or is evacuated. The pressure chamber P1 at the center is circular, and the other pressure chambers P2, P3, and P4 are annular. The pressure chambers P1, P2, P3, and P4 are concentrically arranged.

Internal pressures of the pressure chambers P1, P2, P3, and P4 can be changed independently of one another by a pressure adjusting section, described below. Thus, respective pressing forces against four regions, i.e., a central part, an inner intermediate part, an outer intermediate part, and a peripheral edge of the semiconductor wafer 16 can be independently adjusted. The entire top ring 31A is raised and lowered so that the retainer ring 640 can be pressed against the polishing pad 10 with a predetermined pressing force. A pressure chamber P5 is formed between the chucking plate 644 and the top ring main body 638 so that the pressurized fluid is supplied to the pressure chamber P5 via a fluid path 655 or is evacuated. Thus, the whole of the chucking plate 644 and the elastic pad 642 can move up and down.

The peripheral edge of the semiconductor wafer 16 is surrounded by the retainer ring 640 so that the semiconductor wafer 16 does not project from the top ring 31A during polishing. An opening (not illustrated) is formed in a site of the elastic pad 642, which constitutes the pressure chamber P3, and a vacuum is formed in the pressure chamber P3 so that the semiconductor wafer 16 can be adsorbed to and held in the top ring 31A. Nitrogen gas, dried air, and compressed air are supplied to the pressure chamber P3 so that the semiconductor wafer 16 is released from the top ring 31A.

Figure 4:
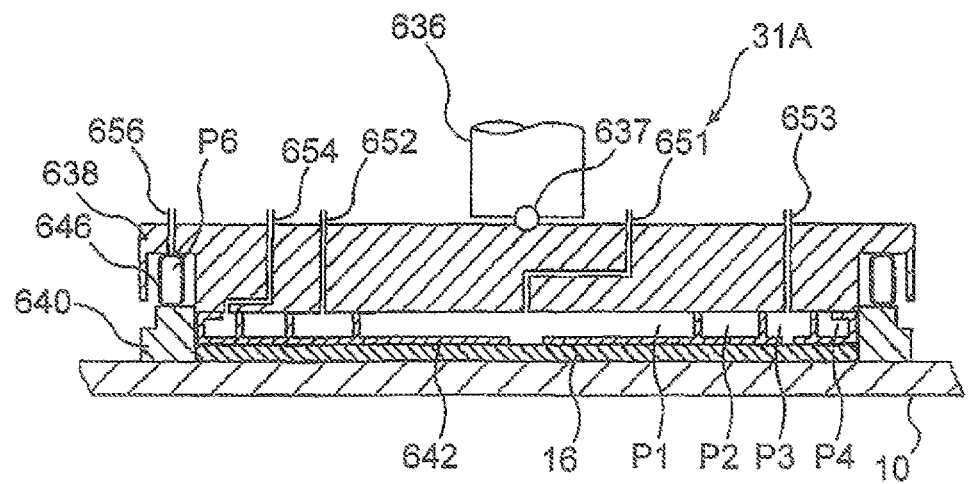
FIG. 4 is a cross-sectional view schematically illustrating an example of another structure of the top ring.

FIG. 4 is a cross-sectional view schematically illustrating an example of another structure of the top ring 31A. In this example, the chucking plate is not provided, and the elastic pad 642 is attached to a bottom surface of the top ring main body 638. The pressure chamber P5 between the chucking plate and the top ring main body 638 is not provided, either. Instead, an elastic bag 646 is arranged between the retainer ring 640 and the top ring main body 638, and a pressure chamber P6 is formed inside the elastic bag 646. The retainer ring 640 is movable up and down relative to the top ring main body 638. A fluid path 656 communicates with the pressure chamber P6 so that a pressurized fluid such as pressurized air is supplied to the pressure chamber P6 via the fluid path 656. An internal pressure of the pressure chamber P6 is adjustable by a pressure adjusting section, described below. Therefore, a pressing force of the retainer ring 640 against the polishing pad 10 can be adjusted independently of a pressing force against the semiconductor wafer 16. Other structures and operations are the same as those of the top ring illustrated in FIG. 3. In the present embodiment, a top ring of any of the types illustrated in FIG. 3 or 4 can be used.

Figure 5:
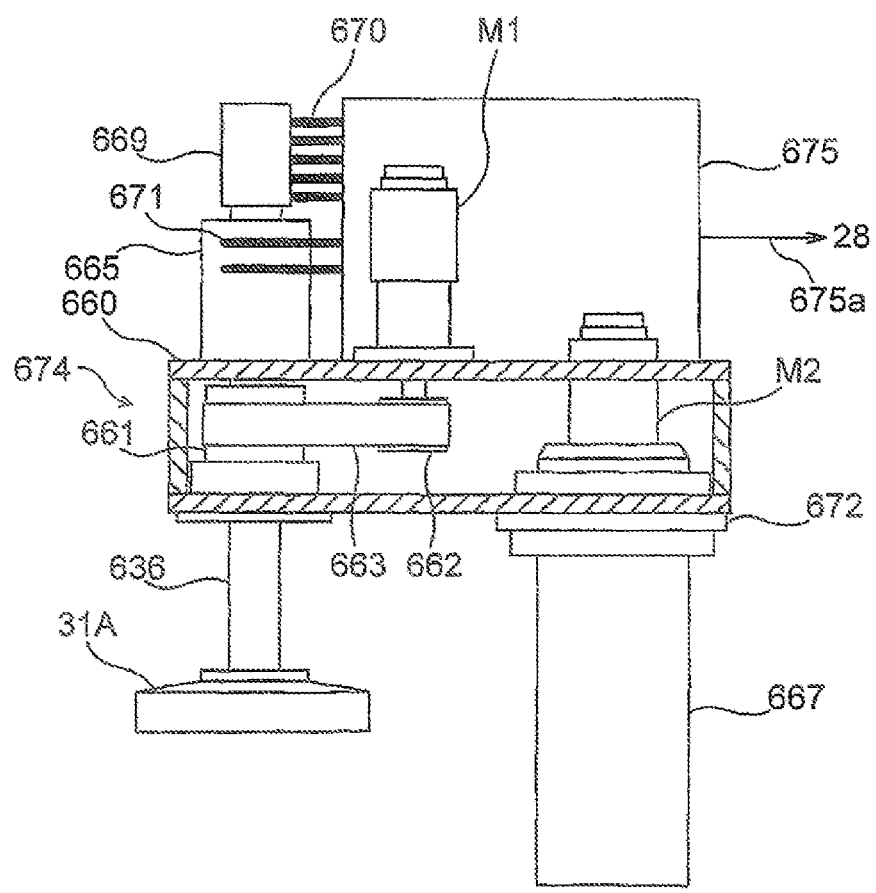
FIG. 5 is a cross-sectional view for illustrating a mechanism for rotating and swinging the top ring.

FIG. 5 is a cross sectional view for illustrating a mechanism for rotating and swinging the top ring 31A. The top ring shaft (e.g., a spline shaft) 636 is rotatably supported on a top ring head 660. The top ring shaft 636 is connected to a rotation axis of a motor M1 via pulleys 661 and 662 and a belt 663, and the top ring shaft 636 and the top ring 31A rotate around their respective axes with the motor M1. The motor M1 is attached to the top of the top ring head 60. An air cylinder 665 serving as an up-and-down drive source connects the top ring head 660 and the top ring shaft 636. The top ring shaft 636 and the top ring 31A integrally move up and down with air (compressed gas) supplied to the air cylinder 665. Note that instead of the air cylinder 665, a mechanism having a ball screw and a servo motor may be also used as the up-and-down drive source.

The top ring head 660 is rotatably supported on a support shaft 667 via a bearing 672. The support shaft 667 is a fixed shaft, and does not rotate. A motor M2 is installed in the top ring head 660, and a relative position between the top ring head 660 and the motor M2 is fixed. A rotation axis of the motor M2 is connected to the support shaft 667 via a rotation transmission mechanism (e.g., a gear) (not illustrated). The motor M2 rotates so that the top ring head 660 swings around the support shaft 667. Therefore, the top ring 31A supported on a leading end of the top ring head 660 moves between an upper polishing position of the rotational table 30A and a side conveyance position of the rotational table 30A by swing motion of the top ring head 660. Note that in the present embodiment, a swing mechanism for swinging the top ring 31A includes the motor M2.

In the top ring shaft 636, a through hole (not illustrated) extending in its longitudinal direction is formed. The fluid paths 651, 652, 653, 654, 655, and 656 in the top ring 31A are connected to a rotation coupling 669 provided at an upper end of the top ring shaft 636 via the through hole. A fluid such as pressurized gas (clean air) or nitrogen gas is supplied to the top ring 31A via the rotation coupling 669, and the top ring 31A is evacuated. A plurality of fluid pipes 670 communicating with the fluid paths 651, 652, 653, 654, 655, and 656 are connected to the rotation coupling 669, and the fluid pipes 670 are connected to a pressure adjusting section 675. A fluid pipe 671, which supplies pressurized air to the air cylinder 665, is also connected to the pressure adjusting section 675.

The pressure adjusting section 675 includes an electropneumatic regulator that regulates a pressure of a fluid supplied to the top ring 31A, pipes connected to the fluid pipes 670 and 671, respectively, air operate valves provided in these pipes, an electropneumatic regulator that regulates a pressure of air serving as an operation source of the air operate valves, and an ejector that forms a vacuum in the top ring 31A, and are gathered together to constitute one block (unit). The pressure adjusting section 675 is fixed to the top of the top ring head 660. The electropneumatic regulator in the pressure adjusting section 675 adjusts respective pressures of pressurized gas supplied to the pressure chambers P1, P2, P3, P4 and P5 in the top ring 31A and pressurized air supplied to the air cylinder 665. Similarly, the ejector in the pressure adjusting section 675 forms a vacuum in the air bags P1, P2, P3, and P4 in the top ring 31A and the pressure chamber P5 between the chucking plate 644 and the top ring main body 638.

Thus, the electropneumatic regulator and the valves serving as pressure adjustment device are installed close to the top ring 31A. Thus, controllability of the pressure within the top ring 31A is improved. More specifically, respective distances between the electropneumatic regulator and the pressure chambers P1, P2, P3, P4, and P5 are short. Thus, responsiveness to a pressure change instruction from the control section 65 is improved. Similarly, an ejector which is a vacuum source is arranged closed to the top ring 31A, and thus responsiveness is improved when a vacuum is formed in the top ring 31A. A reverse surface of the pressure adjusting section 675 can be used as a pedestal for mounting an electric device. The necessity of a mounting frame, which has been conventionally required, can be eliminated.

The top ring head 660, the top ring 31A, the pressure adjusting section 675, the top ring shaft 636, the motor M1, the motor M2, and the air cylinder 665 are configured as one module (hereinafter referred to as a top ring assembly). More specifically, the top ring shaft 636, the motor M1, the motor M2, the pressure adjusting section 675, and the air cylinder 665 are mounted on the top ring head 660. The top ring head 660 is detachable from the support shaft 667. Therefore, the top ring head 660 and the support shaft 667 are separated from each other so that the top ring assembly can be detached from the substrate processing apparatus. Such a configuration enables maintenance properties of the support shaft 667 and the top ring head 660 to be improved. When an abnormal sound is generated from the bearing 672, for example, the bearing 672 can be easily replaced. When the motor M2 and a rotation transmission mechanism (speed reducer) are replaced, an adjacent device needs not to be detached.

Figure 6:
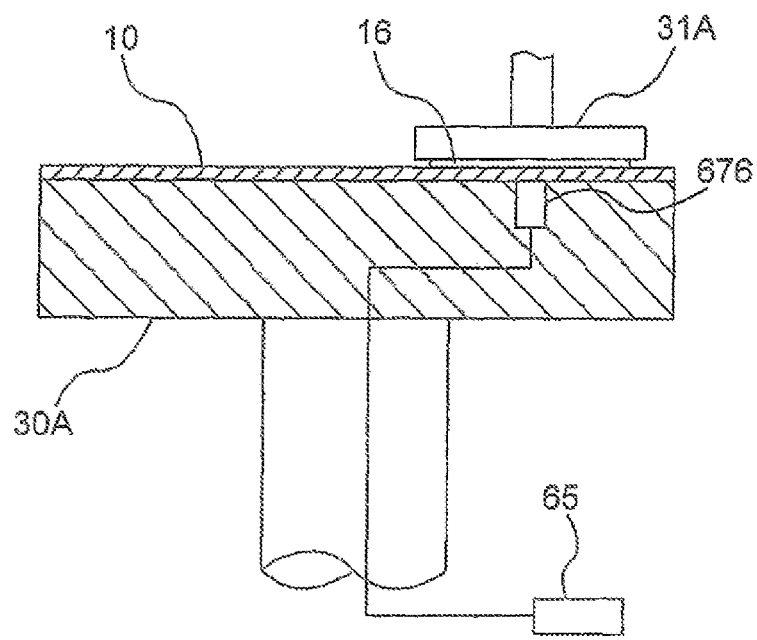
FIG. 6 is a cross-sectional view schematically illustrating an internal structure of a rotational table.

FIG. 6 is a cross-sectional view schematically illustrating an internal structure of the rotational table 30A. As illustrated in FIG. 6, a sensor 676, which detects a state of a film of the semiconductor wafer 16, is embedded inside the rotational table 30A. In this example, an eddy current sensor is used as the sensor 676. A signal of the sensor 676 is transmitted to the control section 65, and the control section 65 generates a monitoring signal representing a film thickness. A value of the monitoring signal (and a sensor signal) does not represent the film thickness itself. However, a value of the monitoring signal changes depending on the film thickness. Therefore, the monitoring signal can be a signal representing the film thickness of the semiconductor wafer 16.

The control section 65 determines internal pressures of the respective pressure chambers P1, P2, P3, and P4 based on the monitoring signal, and issues an instruction to the pressure adjusting section 675 so that the determined internal pressures are formed in the respective pressure chambers P1, P2, P3, and P4. The control section 65 functions as a pressure control portion that operates the internal pressures of the pressure chambers P1, P2, P3, and P4 based on the monitoring signal, and an end point detector that detects a polishing end point.

The sensor 676 is also provided in the rotational table in each of the second polishing unit 3B, the third polishing unit 3C, and the fourth polishing unit 3D, like in the first polishing unit 3A. The control section 65 generates a monitoring signal from a signal transmitted from the sensor 676 of each of the polishing units 3A to 3D, and monitors the progress of polishing of the semiconductor wafer in each of the polishing units 3A to 3D. If the polishing units 3A to 3D polish a plurality of semiconductor wafers, the control section 65 monitors monitoring signals representing the thicknesses of the semiconductor wafers during polishing and controls pressing forces of the top rings 31A to 31D so that polishing times in the polishing units 3A to 3D are substantially the same based on the monitoring signals. Thus, the pressing forces of the top rings 31A to 31D during the polishing are thus adjusted based on the monitoring signals, respectively, so that the polishing times of the polishing units 3A to 3D can be leveled.

The semiconductor wafer 16 may be polished by any one of the first polishing unit 3A, the second polishing unit 3B, the third polishing unit 3C, and the fourth polishing unit 3D, or may be continuously polished by the plurality of polishing units previously selected among the polishing units 3A to 3D. For example, the first polishing unit 3A and the second polishing unit 3B may polish the semiconductor wafer 16 in this order. Alternatively, the third polishing unit 3C and the fourth polishing unit 3D may polish the semiconductor wafer 16 in this order. Furthermore, the first polishing unit 3A, the second polishing unit 3B, the third polishing unit 3C, and the fourth polishing unit 3D may polish the semiconductor wafer 16 in this order. In either case, the polishing times in all the polishing units 3A to 3D are leveled so that throughput can be improved.

The eddy current sensor is appropriately used when the film of the semiconductor wafer is metallic film. If the film of the semiconductor wafer is a film having light permeability such as an oxide film, an optical sensor can be used as the sensor 676. Alternatively, a microwave sensor may be used as the sensor 676. The microwave sensor can be used regardless of whether the film of the semiconductor wafer is a metallic film or a nonmetallic film. An example of the optical sensor and the microwave sensor will be described below.

Figure 7:
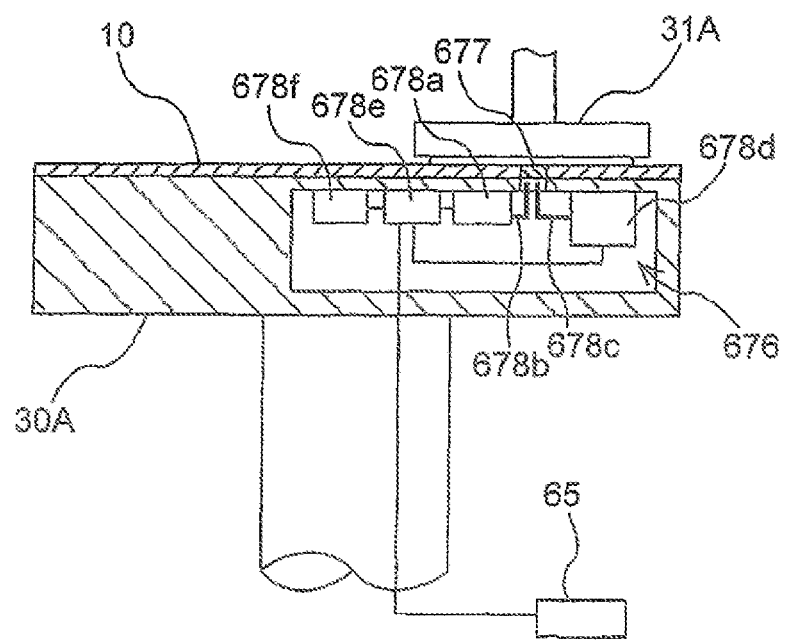
FIG. 7 is a schematic diagram illustrating a rotational table including an optical sensor.

FIG. 7 is a schematic diagram illustrating a rotational table including an optical sensor. As illustrated in FIG. 7, an optical sensor 676, which detects a state of the film of the semiconductor wafer 16, is embedded in the rotational table 30A. The sensor 676 irradiates the semiconductor wafer 16 with light, and detects a state (film thickness, etc.) of the film of the semiconductor wafer 16 from an intensity (reflection intensity or reflectivity) of reflected light from the semiconductor wafer 16.

A light transmission portion 677 for transmitting the light from the sensor 676 is attached to the polishing pad 10. The light transmission portion 677 is formed of a material having a high transmission factor, and is formed of non-foamed polyurethane, for example. Alternatively, the light transmission portion 677 may be formed by providing the polishing pad 10 with a through hole and causing a transparent liquid to flow from below while the semiconductor wafer 16 closes the through hole. The light transmission portion 677 is arranged at a position where it passes through the center of the semiconductor wafer 16 held in the top ring 31A.

As illustrated in FIG. 7, the sensor 676 includes a light source 678a, a light emission optical fiber 678b serving as a light emitter that irradiates a surface to be polished of the semiconductor wafer 16 with light from the light source 678a, a light receiving optical fiber 678c serving as a light receiver that receives light reflected from the surface to be polished, a spectroscope unit 678d including a spectroscope that disperses the light received by the light receiving optical fiber 678c and a plurality of light receiving elements that store the light dispersed by the spectroscope as electrical information, an operation control portion 678e that controls lighting and extinction of the light source 678a and a timing of the start of reading of the light receiving elements within the spectroscope unit 678*d*, and a power source 678*f* that supplies power to the operation control portion 678*e*. Note that power is supplied to the light source 678*a* and the spectroscope unit 678*d* via the operation control portion 678*e*.

A light emission end of the light emission optical fiber 678*b* and a light receiving end of the light receiving optical fiber 678*c* are substantially perpendicular to the surface to be polished of the semiconductor wafer 16. A photodiode array of 128 elements, for example, can be used as the light receiving elements in the spectroscope unit 678*d*. The spectroscope unit 678*d* is connected to the operation control portion 678*e*. Information from the light receiving element in the spectroscope unit 678*d* is transmitted to the operation control portion 678*e*, and spectrum data of the reflected light is generated based on the information. That is, the operation control portion 678*e* reads electrical information stored in the light receiving element, to generate the spectrum data of the reflected light. The spectrum data represents an intensity of the reflected light decomposed according to a wavelength, and changes depending on the film thickness.

The operation control portion 678*e* is connected to the above described control section 65. Thus, the spectrum data generated by the operation control portion 678*e* is transmitted to the control section 65. In the control section 65, a characteristic value associated with the film thickness of the semiconductor wafer 16 is calculated based on the spectrum data received from the operation control portion 678*e*, and uses the characteristic value as a monitoring signal.

Figure 8:
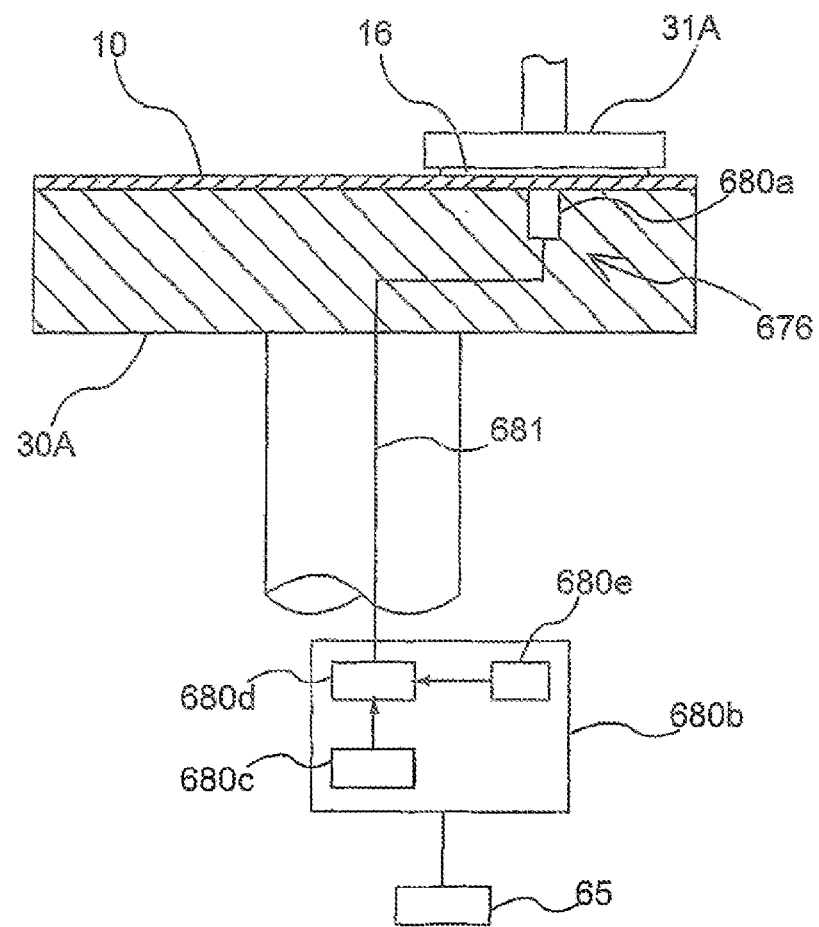
FIG. 8 is a schematic diagram illustrating a rotational table including a microwave sensor.

FIG. 8 is a schematic diagram illustrating a rotational table including a microwave sensor. A sensor 676 includes an antenna 680*a* that irradiates a surface to be polished of a semiconductor wafer 16 with a microwave, a sensor main body 680*b* that supplies the microwave to the antenna 680*a*, and a waveguide 681 that connects the antenna 680*a* and the sensor main body 680*b*. The antenna 680*a* is embedded in the rotational table 30A, and is arranged to oppose a position at the center of the semiconductor wafer 16 held in the top ring 31A.

The sensor main body 680*b* includes a microwave source 680*c* that generates a microwave and supplies the microwave to the antenna 680*a*, a separator 680*d* that separates the microwave (incident wave) generated by the microwave source 680*c* and a microwave (reflected wave) reflected from a surface of the semiconductor wafer 16, and a detection portion 680*e* that receives the reflected wave obtained by the separation by the separator 680*d* and detects an amplitude and a phase of the reflected wave. Note that a directional coupler is appropriately used as the separator 680*d*.

The antenna 680*a* is connected to the separator 680*d* via the waveguide 681. The microwave source 680*c* is connected to the separator 680*d*, and the microwave generated by the microwave source 680*c* is supplied to the antenna 680*a* via the separator 680*d* and the waveguide 681. The microwave is irradiated toward the semiconductor wafer 16 from the antenna 680*a*, to reach the semiconductor wafer 16 after penetrating the polishing pad 10. The reflected wave from the semiconductor wafer 16 is received by the antenna 680*a* again after penetrating the polishing pad 10.

The reflected wave is sent to the separator 680*d* from the antenna 680*a* via the waveguide 681. The separator 680*d* separates the incident wave and the reflected wave. The reflected wave obtained by the separation by the separator 680*d* is transmitted to the detection portion 680*e*. The detection portion 680*e* detects the amplitude and the phase of the reflected wave. The amplitude of the reflected wave is detected as power (dbm or W) or a voltage (V), and the phase of the reflected wave is detected by a phase measuring device (not illustrated) contained in the detection portion 680*e*. The amplitude and the phase of the reflected wave, which have been detected by the detection portion 680*e*, are sent to the control section 65. The film thickness of the metallic film or the nonmetallic film of the semiconductor wafer 16 is analyzed based on the amplitude and the phase of the reflected wave. The control section 65 monitors a value obtained by the analysis as a monitoring signal.

As illustrated in FIG. 1, the dresser 33A includes a dresser arm 685, a dressing member 686 rotatably attached to a leading end of the dresser arm 685, a swing shaft 688 connected to the other end of the dresser arm 685, and a motor serving as a driving mechanism that swings the dresser arm 685 around the swing shaft 688. The dressing member 686 has a circular dressing surface, and hard particles are fixed to the dressing surface. The hard particles include diamond particles and ceramic particles. The dresser arm 685 includes a motor (not illustrated). The motor rotates the dressing member 686. The swing shaft 688 is connected to a lifting mechanism (not illustrated). The lifting mechanism lowers the dresser arm 685 so that the dressing member 686 presses the polishing surface of the polishing pad 10.

The atomizer 34A illustrated in FIG. 1 includes an arm 690 having one or a plurality of injection holes at its bottom, a fluid path connected to the arm 690, and a swing shaft 694 that supports the arm 690. A plurality of injection holes are equally spaced at the bottom of the arm 690.

An example of a fluid to be used includes a fluid (e.g., pure water) or a mixed fluid of a fluid and gas (e.g., a mixed fluid of pure water and nitrogen gas). The fluid path communicates with the injection holes in the arm 690, and the fluid is injected as a mist onto the polishing surface of the polishing pad 10 from the injection holes.

The arm 690 can swirl between a cleaning position and a retreat position around a swing shaft 694. A movable angle of the arm 690 is approximately 90°. The arm 690 is normally at the cleaning position, and is arranged along the radius of the polishing surface of the polishing pad 10, as illustrated in FIG. 1. During maintenance such as replacement of the polishing pad 10, the arm 690 manually moves to the retreat position. Therefore, the arm 690 need not be detached during the maintenance so that a maintenance property can be improved. Note that a rotation mechanism may be connected to the swing shaft 694, to swirl the arm 690.

A purpose of providing the atomizer 34A is to rinse away a polishing sludge or an abrasive grain remaining on the polishing surface of the polishing pad 10 with a high-pressure fluid. More preferable dressing, i.e., reproduction of the polishing surface can be achieved by purification of the polishing surface by a fluid pressure of the atomizer 34A and dressing work of the polishing surface by the dresser 33A serving as mechanical contact. The polishing surface may generally, in many cases, be reproduced by the atomizer after being dressed by a contact dresser (e.g., a diamond dresser).

Next, a transport mechanism for transporting a semiconductor wafer will be described with reference to FIG. 1. The transport mechanism includes a lifter 11, a first linear transporter 66, a swing transporter 12, a second linear transporter 67, and a temporary placement stand.

The lifter 11 receives the semiconductor wafer from the transport robot 22. The first linear transporter 66 transports the semiconductor wafer received from the lifter 11 among a first transport position TP1, a second transport position TP2, a third transport position TP3, and a fourth transport position TP4. The first polishing unit 3A and the second polishing unit 3B receive the semiconductor wafer from the first linear transporter 66 and polish the semiconductor wafer. The first polishing unit 3A and the second polishing unit 3B pass the polished semiconductor wafer to the first linear transporter 66.

The swing transporter 12 delivers the semiconductor wafer between the first linear transporter 66 and the second linear transporter 67. The second linear transporter 67 transports the semiconductor wafer received from the swing transporter 12 among a fifth transport position TP5, a sixth transport position TP6, and a seventh transport position TP7. The third polishing unit 3C and the fourth polishing unit 3D receive the semiconductor wafer from the second linear transporter 67 and polish the semiconductor wafer. The third polishing unit 3C and the fourth polishing unit 3D pass the polished semiconductor wafer to the second linear transporter 67. The semiconductor wafer polished by the polishing unit 3 is placed on the temporary placement stand by the swing transporter 12.

As illustrated in FIG. 1, the cleaning section 64 is partitioned into a first cleaning chamber 190, a first transport chamber 191, a second cleaning chamber 192, a second transport chamber 193, and a drying chamber 194. In the first cleaning chamber 190, an upper primary cleaning module and a lower primary cleaning module arranged in a longitudinal direction are disposed. The upper primary cleaning module is disposed above the lower primary cleaning module. Similarly, in the second cleaning chamber 192, an upper secondary cleaning module and a lower secondary cleaning module arranged in the longitudinal direction are disposed. The upper secondary cleaning module is disposed above the lower secondary cleaning module. The primary and secondary cleaning modules are cleaning machines configured to clean a semiconductor wafer using a cleaning liquid. These primary and secondary cleaning modules are arranged in the vertical direction, and therefore have an advantage that a footprint area is small.

The temporary placement stand for a semiconductor wafer is provided between the upper secondary cleaning module and the lower secondary cleaning module. In the drying chamber 194, an upper drying module and a lower drying module arranged in a longitudinal direction are disposed. The upper drying module and the lower drying module are isolated from each other. Filter fan units for supplying clean air into the upper drying module and the lower drying module are provided above the upper drying module and the lower drying module, respectively. The upper primary cleaning module, the lower primary cleaning module, the upper secondary cleaning module, the lower secondary cleaning module, the temporary placement stand, the upper drying module, and the lower drying module are fixed to a frame via bolts and the like.

In the first transport chamber 191, a first transport robot that can move in an up-and-down direction is disposed. In the second transport chamber 193, a second transport robot that can move in an up-and-down direction is disposed. The first transport robot and the second transport robot are supported by support shafts extending in the longitudinal direction so as to be movable, respectively. The first transport robot and the second transport robot each have a driving mechanism such as a motor therein and can move in the up-and-down direction along the support shafts, respectively. Like the transport robot 22, the first transport robot has two-stage hands composed of upper and lower hands.

The first transport robot is disposed at a position where the lower hand thereof can access the above-described temporary placement stand. When the lower hand of the first transport robot accesses the temporary placement stand, a shutter provided in the partition wall 1b is configured to be open.

The first transport robot operates so as to transport the semiconductor wafer 16 among the temporary placement stand, the upper primary cleaning module, the lower primary cleaning module, the temporary placement stand, the upper secondary cleaning module, and the lower secondary cleaning module. When the semiconductor wafer before cleaning (semiconductor wafer to which a slurry is attached) is transported, the first transport robot uses the lower hand. When the semiconductor wafer after cleaning is transported, the first transport robot uses the upper hand. The second transport robot operates so as to transport the semiconductor wafer 16 among the upper secondary cleaning module, the lower secondary cleaning module, the temporary placement stand, the upper drying module, and the lower drying module. The second transport robot transports only a cleaned semiconductor wafer, and therefore has only one hand. The transport robot 22 illustrated in FIG. 1 unloads the semiconductor wafer from the upper drying module or the lower drying module using the upper hand thereof and returns the semiconductor wafer to a wafer cassette. When the upper hand of the transport robot 22 accesses the drying module, a shutter (not illustrated) provided in the partition wall 1a is configured to be open.

The cleaning section 64 includes two primary cleaning modules and two secondary cleaning modules, and thus can provide a plurality of cleaning lines for cleaning a plurality of semiconductor wafers in parallel. The "cleaning line" is defined as a transfer path used when one semiconductor wafer is cleaned by a plurality of cleaning modules in the cleaning section 64. For example, it is possible to transport one semiconductor wafer sequentially through the first transport robot, the upper primary cleaning module, the first transport robot, the upper secondary cleaning module, the second transport robot, and the upper drying module, and in parallel to this, transport another semiconductor wafer sequentially through the first transport robot, the lower primary cleaning module, the first transport robot, the lower secondary cleaning module, the second transport robot, and the lower drying module. In this way, with the two parallel cleaning lines, it is possible to clean and dry a plurality of (typically, two) semiconductor wafers substantially at the same time.

The dried semiconductor wafer 16 is unloaded from the drying module by the transport robot 22 illustrated in FIG. 1, and is returned to the wafer cassette. In this manner, the semiconductor wafer is subjected to a series of processes including polishing, cleaning, and drying. The drying module configured as described above can dry both sides of the semiconductor wafer 16 promptly and effectively, and can accurately control the end time point of the drying processing. Therefore, the processing time of the drying processing never becomes a rate-determining step of the whole cleaning process. Since the processing times on a plurality of above-described cleaning lines formed in the cleaning section 4 can be leveled, it is possible to improve the throughput of the entire process.

According to the present embodiment, when the semiconductor wafer is transferred (before loading) to the polishing apparatus, the semiconductor wafer is in a dried state, and after completion of polishing and cleaning, the semiconductor wafer is in a dried state before being unloaded and is unloaded into the cassette. The semiconductor wafer in a dried state is put to the cassette from the polishing apparatus, and can be taken out. That is, dry in/dry out is possible.

The semiconductor wafer placed on the temporary placement stand is transported to the first cleaning chamber 190 or the second cleaning chamber 192 via the first transport chamber 191. The semiconductor wafer is cleaned in the first cleaning chamber 190 or the second cleaning chamber 192. The semiconductor wafer cleaned in the first cleaning chamber 190 or the second cleaning chamber 192 is transported to the drying chamber 194 via the second transport chamber 193. The semiconductor wafer is dried in the drying chamber 194. The dried semiconductor wafer is taken out of the drying chamber 194 and returned to the cassette by the transport robot 22.

Figure 9:
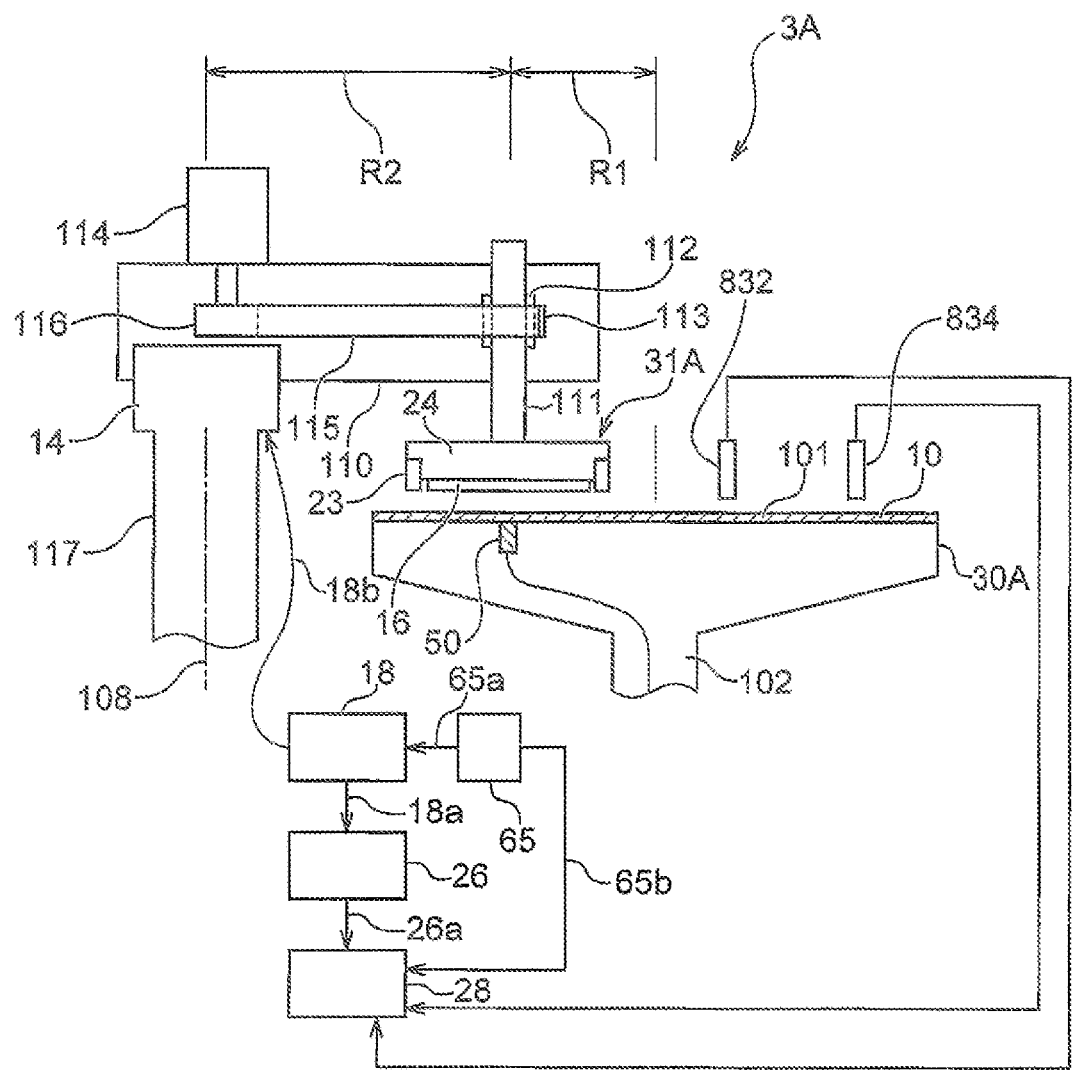
FIG. 9 is a schematic diagram illustrating an overall configuration of a polishing apparatus according to one embodiment of the present invention.

FIG. 9 is a schematic diagram illustrating an overall configuration of a polishing unit (polishing apparatus) according to one embodiment of the present invention. As illustrated in FIG. 9, the polishing apparatus includes a rotational table 30A, and a top ring 31A (holding section) that holds a substrate such as a semiconductor wafer 16 which is a target and presses the substrate against a polishing surface on the rotational table.

The first polishing unit 3A is a polishing unit for polishing between the polishing pad 10 and the semiconductor wafer 16 disposed facing the polishing pad 10. The first polishing unit 3A includes the rotational table 30A for holding the polishing pad 10, and the top ring 31A for holding the semiconductor wafer 16. The first polishing unit 3A includes a swing arm 110 for holding the top ring 31A, a swing shaft motor 14 (arm drive section) for causing the swing arm 110 to swing, and a driver 18 that supplies drive power to the swing shaft motor 14. The first polishing unit 3A further includes an arm torque detection section 26 that detects arm torque applied to the swing arm 110, and an end point detection section 28 that detects a polishing end point indicating an end of polishing based on the arm torque 26a detected by the arm torque detection section 26.

According to the present embodiment described with reference to FIG. 9 and the following figures, it is possible to provide the polishing unit 3A in which the measurement accuracy of the film thickness is improved. Furthermore, the polishing unit 3A of the present embodiment can detect abnormalities of change in the film thickness. The polishing unit 3A includes a machine learning apparatus. As the polishing end point detection means, a method using an eddy current sensor, a method based on arm torque and a method of detecting and using a drive load of the drive section that drives to rotate the rotational table or the top ring are possible in the present embodiment. A scheme will be described in the present embodiment in which the top ring is held at an end portion of the swing arm and a polishing end point is detected based on the arm torque, and it is likewise possible to detect a polishing end point by detecting a drive load of the drive section that drives to rotate the rotational table or the top ring, by the motor current.

The holding section, the swing arm, the arm drive section and the torque detection section form a set, and sets of the same configuration are provided in the first polishing unit 3A, the second polishing unit 3B, the third polishing unit 3C, and the fourth polishing unit 3D, respectively.

The rotational table 30A is connected to a motor (not illustrated), which is a drive section, disposed therebelow via a table shaft 102 and is rotatable around the table shaft 102. The polishing pad 10 is pasted to the top surface of the rotational table 30A, and a surface 101 of the polishing pad 10 constitutes a polishing surface for polishing the semiconductor wafer 16. A polishing liquid supply nozzle (not illustrated) is provided above the rotational table 30A, and the polishing liquid supply nozzle supplies a polishing liquid Q to the polishing pad 10 on the rotational table 30A. As illustrated in FIG. 9, an eddy current sensor 50 that can detect a polishing end point by generating an eddy current in the semiconductor wafer 16 and detecting the eddy current may be embedded in the rotational table 30A.

The top ring 31A includes a top ring main body 24 that presses the semiconductor wafer 16 against the polishing surface 101, and a retainer ring 23 that holds an outer circumferential edge of the semiconductor wafer 16 so that the semiconductor wafer 16 does not slip out of the top ring.

The top ring 31A is connected to the top ring shaft 111. The top ring shaft 111 is caused by an up-and-down motion mechanism, which is not illustrated, to move in the up-and-down direction relative to the swing arm 110. The up-and-down motion of the top ring shaft 111 causes the entire top ring 31A to ascend or descend and causes it to be positioned relative to the swing arm 110.

The top ring shaft 111 is connected to a rotary cylinder 112 via a key (not illustrated). The rotary cylinder 112 is provided with a timing pulley 113 on its circumferential portion. A top ring motor 114 is fixed to the swing arm 110. The above-described timing pulley 113 is connected to a timing pulley 116 provided for the top ring motor 114 via a timing belt 115. As the top ring motor 114 rotates, the rotary cylinder 112 and the top ring shaft 111 integrally rotate via the timing pulley 116, the timing belt 115, and the timing pulley 113, and thus the top ring 31A rotates.

The swing arm 110 is connected to the rotation shaft of the swing shaft motor 14. The swing shaft motor 14 is fixed to a swing arm shaft 117. Therefore, the swing arm 110 is rotatably supported by the swing arm shaft 117.

The top ring 31A can hold a substrate such as the semiconductor wafer 16 to an undersurface thereof. The swing arm 110 can turn around the swing arm shaft 117. The top ring 31A that holds the semiconductor wafer 16 to its undersurface is moved from a position at which it receives the semiconductor wafer 16 to a position above the rotational table 30A as the swing arm 110 turns. The top ring 31A is caused to descend to press the semiconductor wafer 16 against the surface (polishing surface) 101 of the polishing pad 10. At this time, each of the top ring 31A and the polishing rotational table 30A is caused to rotate. At the same time, a polishing liquid is supplied onto the polishing pad 10 from the polishing liquid supply nozzle provided above the rotational table 30A. In this way, the surface of the semiconductor wafer 16 is polished by causing the semiconductor wafer 16 to slide on the polishing surface 101 of the polishing pad 10.

The first polishing unit 3A includes a table drive section (not illustrated) that drives to rotate the rotational table 30A. The first polishing unit 3A may include a table torque detection section (not illustrated) that detects table torque applied to the rotational table 30A. The table torque detection section can detect table torque from the current of the table drive section, which is a rotation motor. The end point detection section 28 may detect a polishing end point indicating an end of polishing only from the arm torque 26a detected by the arm torque detection section 26 or may detect a polishing end point indicating an end of polishing by taking into account the table torque detected by the table torque detection section as well.

The arm torque detection section 26 detects arm torque 26a applied to the swing arm 110 at the connection part of the swing arm 110 to the swing shaft motor 14 in FIG. 9.

More specifically, the arm drive section is the swing shaft motor (rotation motor) 14 that causes the swing arm 110 to rotate and the arm torque detection section 26 detects the arm torque 26a applied to the swing arm 110 from the current value of the swing shaft motor 14. The current value of the swing shaft motor 14 is an amount that depends on arm torque at the connection part of the swing arm 110 to the swing shaft motor 14. The current value of the swing shaft motor 14 is a current value 18b supplied from the driver 18 to the swing shaft motor 14 or a current command 18a, which is described later, generated in the driver 18.

The driver 18 receives a position command 65a relating to the position of the swing arm 110 from the control section 65. The position command 65a is data corresponding to a rotational angle of the swing arm 110 with respect to the swing arm shaft 117. The driver 18 also receives a rotational angle of the swing arm shaft 117 from an encoder (not illustrated) incorporated in and attached to the swing shaft motor 14.

The current command 18a is an amount that depends on the current value of the swing shaft motor 14 and an amount that depends on arm torque. The arm torque detection section 26 applies processing such as at least one of AD conversion, amplification, rectification, and effective value conversion to the current command 18a, and then outputs the processed current command to the end point detection section 28 as the arm torque 26a.

A current value is generated from the current command 18a. The current value is a current value of the swing shaft motor 14 itself and is a value that depends on arm torque. The arm torque detection section 26 may detect arm torque applied to the swing arm 110 from the current value. The arm torque detection section 26 can use a current sensor such as a Hall sensor to detect the current value.

A current value of one electric motor among a motor M3 (first electric motor, see FIG. 2) for driving to rotate the rotational table, a motor M1 (second electric motor, see FIG. 5) for driving to rotate the top ring 31A, a motor M2 (third electric motor, see FIG. 5) for swinging the swing arm can be detected. A film thickness calculating section 830 (see FIG. 10) of the end point detection section 28 can determine the film thickness from a correspondence relationship between the current command 18a and the current value and the film thickness. For example, the correspondence relationship between the current command 18a and the current value and the film thickness can be obtained before starting the polishing step, and be stored in the film thickness calculating section 830.

Next, the end point detection section 28 (machine learning apparatus) capable of learning a change in the film thickness of the semiconductor wafer 16 (target) will be described with reference to FIG. 10. The end point detection section 28 includes a state acquisition section 846 capable of acquiring a state variable including at least one of data on the state of device making up the polishing unit 3A and data on the state of the semiconductor wafer 16, and a learning section 848 capable of leaning the change based on the state variable. For example, the device making up the polishing unit 3A is a device making up the polishing unit 3A including the top ring 31A, the rotational table 30A, the polishing liquid supply nozzle 32A, the dresser 33A, the atomizer 34A, and the like.

The data on the state of the device making up the polishing unit 3A includes at least one of data on the arrangement of the device, data on the operation state of the device, and data on the state of exhaustion of the device.

The data on the state of the semiconductor wafer 16 includes at least one of data detected by the film thickness calculating section 830 capable of detecting the film thickness of the semiconductor wafer 16, data detected by a temperature sensor 832 (temperature detection section) capable of detecting the temperature of the semiconductor wafer 16, data detected by the control section 65 (pressure detection section) capable of detecting the pressure applied to the semiconductor wafer 16, and data on the characteristics of the target. As for pressures applied to the semiconductor wafer 16, the control section 65 can detect the pressures using the pressure sensors provided in the respective fluid paths 651, 652, 653, and 654.

The film thickness detection section includes a film thickness sensor (eddy current type, motor current type, optical type, and the like), and a motor drive section that outputs a current command instructing a current value of the motor. In a case of the motor drive section, data detected by the film thickness detection section (motor drive section) is a current value of the motor or the current command.

The temperature detection section includes the temperature sensor and a resistor capable of detecting the temperature of the target which is a resistor in a circuit located in the vicinity of the target. The pressure detection section includes a pressure sensor, and a control section that outputs a pressure applied to the target, as a control current, a control voltage, or a pressure command, to the pressure adjusting section. In a case of the control section, the data detected by the pressure detection section (control section) is a control current, a control voltage, or a pressure command.

For learning, the data is transmitted to the state acquisition section 846 in the end point detection section 28. That is, the data detected by the film thickness calculating section 830 is transmitted, as a signal 830a, from the film thickness calculating section 830 to the state acquisition section 846. The data detected by the temperature sensor 832 (temperature detection section) is transmitted from the temperature sensor 832 to the state acquisition section 846. The data detected by the control section 65 (pressure detection section) is transmitted, as a signal 65b, from the control section 65 to the state acquisition section 846.

The temperature detection section includes not only the temperature sensor 832 but also a resistor capable of detecting the temperature of the semiconductor wafer 16 which is a resistor in a circuit in the polishing unit 3A that is located in the vicinity of the semiconductor wafer 16. The temperature sensor 832 is disposed in the vicinity of the semiconductor wafer 16, and the output of the temperature sensor 832 is transmitted to the state acquisition section 846 in the end point detection section 28.

The pressure detection section includes the pressure sensors, and the control section 65 that outputs the pressures applied to the semiconductor wafer 16, as pressure commands, to the pressure adjusting section 675. When the control section 65 is a pressure detection section, the data detected by the control section 65 may be a pressure command. For learning, the pressure command is output, as a signal 65b, from the control section 65 to the state acquisition section 846 in addition to the pressure adjusting section 675.

The data on the arrangement of the device includes at least one of data on the position of the top ring 31A capable of holding the target, data on the position of the rotational table 30A capable of rotating the polishing pad to polish the target, data on the position of the arm 110 holding the top ring 31A, and data on the position of the dresser 33A capable of performing dressing the polishing pad 10.

For example, the data on the position of the top ring 31A includes a position (two-dimensional coordinate value) on a plane of the rotational table 30A, and/or a rotational angle of the top ring 31A. For example, the data on the position of the rotational table 30A/the arm 110/the dresser 33A includes a rotational angle of the rotational table 30A/the arm 110/the dresser 33A. Note that "/" used in herein means "and/or." For example, the data on the position of the top ring 31A/the rotational table 30A/the arm 110/the dresser 33A includes the relative positions (two-dimensional coordinate values) of these devices on the plane of the rotational table 30A.

The data on the arrangement of the device may include the data on the position of the semiconductor wafer 16. For example, the data on the position of the semiconductor wafer 16 includes a position (two-dimensional coordinate value) on a plane of the rotational table 30A, and/or a rotational angle of the semiconductor wafer 16. For example, the control section 65/the state acquisition section 846 may calculate the data on the position of the semiconductor wafer 16 from the above-described data on the position of the top ring 31A/the rotational table 30A/the arm 110/the dresser 33A.

For example, the data is a control command to be output from the control section 65 to the drive section that drives each of the arm holding the top ring 31A, the rotational table 30A, the arm holding the polishing liquid supply nozzle 32A, and the arm for the dresser 33A. For example, the control command is a rotational angle. For learning, the control command is output, as a signal 65b, from the control section 65 to the state acquisition section 846 in addition to the drive section.

The data on the operation state of the device includes at least one of data on the number of revolutions of the top ring 31A, and data on the number of revolutions of the rotational table. The data is a control command to be output from the control section 65 to the drive section that drives to rotate each of the top ring 31A and the rotational table 30A. For example, the control command is the number of revolutions. For learning, the control command is output, as a signal 65b, from the control section 65 to the state acquisition section 846 in addition to the drive section.

The data on the state of exhaustion of the device includes at least one of data on the use time of the consumable part included in the polishing apparatus, and data on the consumed amount of the consumable part. Examples of the consumable part include the polishing pad 10/the retainer ring of the top ring 31A/a membrane. The data on the use time of the polishing pad 10/the retainer ring of the top ring 31A/the membrane is stored in the control section 65. For learning, the control section 65 outputs the data on the use time as a signal 65b to the state acquisition section 846. The data on the consumed amount of the polishing pad 10 is a wear amount of the polishing pad 10. The wear amount is measured by an optical sensor 834. The optical sensor 834 detects the wear amount by measuring a distance between the polishing pad 10 and the optical sensor 834. For learning, the optical sensor 834 outputs the data on the wear amount to the state acquisition section 846.

The data on characteristics of the semiconductor wafer 16 includes at least one of data on the material of the semiconductor wafer 16 itself/a film/circuit formed on the semiconductor wafer 16, and data on the film thickness and the circuit pattern on the semiconductor wafer 16 before being polished by the polishing apparatus. The data on the material of the semiconductor wafer 16 itself is data indicating that the material of the substrate is copper, aluminum, Si, GaAs, SOI, glass, SiC, ceramic, resin, and the like. Alternatively, the data on the material of the semiconductor wafer 16 is data indicating a mixing ratio of these metals and a mixing ratio of the oxide film. Examples of the data on the film thickness and the circuit pattern before polishing include numerical data indicating the film thickness, and data in which the circuit pattern is classified. Examples of the data in which the circuit pattern is classified include numerical data indicating a ratio of a plurality of metal components contained in the semiconductor wafer 16. The data is input to the control section 65 before a user starts polishing. The control section 65 outputs the data as a signal 65c to the state acquisition section 846.

In the present embodiment, the data that can be input to the learning section 848 via the state acquisition section 846 for learning of the learning section 848 is a part or all of the data on the following amounts:

i) torque applied to the swing arm 110 from the top ring 31A during polishing;
ii) a motor current of the rotational table 30A, the top ring 31A, and the swing shaft motor 14;
iii) an elapsed time from the start of polishing;
iv) the number of revolutions of the rotational table 30A;
v) an amount of pressure against the semiconductor wafer 16;
vi) a temperature of the polishing pad 10;
vii) a flow rate of slurry supplied from the polishing liquid supply nozzle 32A;
viii) a type of film (type of film such as an oxide film or a conductive film) on the semiconductor wafer 16;
ix) a film thickness of the semiconductor wafer 16;
x) the number of revolutions of the top ring 31A;
xi) a swing speed of the swing arm 110;
xii) a thickness of the polishing pad 10;
xiii) a use time of consumable parts such as the polishing pad 10;
xiv) output of the optical sensor;
xv) output of the eddy current sensor;
xvi) output of the microwave sensor;
xvii) output of an ultrasonic sensor; and
xviii) output of an oscillating (acoustic-wave) sensor.

Examples of data that is preferable for learning the change in the film thickness among the above-described data include the following seven types of data. That is, i) torque applied to the swing arm 110 from the top ring 31A during polishing, iii) an elapsed time from the start of polishing, iv) the number of revolutions of the rotational table 30A, v) an amount of pressure against the semiconductor wafer 16, vi) a temperature of the polishing pad 10, x) the number of revolutions of the top ring 31A, and xi) a swing speed of the swing arm 110.

Examples of data that is particularly preferable for learning the change in the film thickness include the following five types of data. That is, i) torque applied to the swing arm 110 from the top ring 31A during polishing, iii) an elapsed time from the start of polishing, v) an amount of pressure against the semiconductor wafer 16, vi) a temperature of the polishing pad 10, and xi) a swing speed of the swing arm 110.

Examples of data that is more preferable for learning the change in the film thickness include the following three types of data. That is, i) torque applied to the swing arm 110 from the top ring 31A during polishing, iii) an elapsed time from the start of polishing, and vi) a temperature of the polishing pad 10. The selection of data such as the seven types of data, the five types of data, and the three types of data is not limited to thereto, and other combinations are also possible. The number of types is limited to three, five and seven, and a greater or lesser number of types may be selected. The data that is preferable for learning the change in the film thickness can be determined from the polishing conditions, the state of the semiconductor wafer 16, and the like.

The end point detection section 28 (machine learning apparatus) includes a determination data acquisition section 844 that acquires determination data indicating the presence or absence of abnormality or degree of abnormality of the polishing unit 3A. The learning section 848 learns the change in the film thickness of the semiconductor wafer 16 based on the data set created based on a combination of the state variable and the determination data.

The learning section 848 can predict the change in the film thickness of the semiconductor wafer 16 after learning the change. Furthermore, the learning section 848 can learn the change in the film thickness of the semiconductor wafer 16 to determine whether the change is normal or abnormal.

In the present embodiment, the polishing apparatus includes the learning section capable of learning the change based on the state variable including at least one of the data on the state of the device and the data on the state of the target, whereby the accuracy of the end point detection can be improved. For example, the accuracy of the end point detection can be improved by learning the film thickness detection section and the other detection sections (temperature detection section, pressure detection section for detecting an air bag pressure, or the like) and the use time of the consumable part. Furthermore, it is possible to provide a machine learning apparatus capable of reducing the influence of time delay for the film thickness recognized by the processing system and the communication system, and the polishing apparatus.

Note that the change in film thickness means not only change in film thickness itself but also change in amount depending on the film thickness. For example, it means change of data itself to be output by the film thickness sensor or change of data after the data to be output by the film thickness sensor is subjected to the noise removal processing.

The data which the learning section 848 can output is not limited to the data indicating the predicted change in the film thickness (that is, the change in the film thickness as time series data, the polishing end point time, and the like) and the data indicating a determination result of whether the change is normal or abnormal (for example, "1" is output when the change is normal, and "zero" is output when the change is abnormal, or the like). Examples of the data which the learning section 848 can output are follows:
i) polishing end point time, and a prediction output of a film thickness sensor (a torque sensor, a current sensor, an eddy current sensor, and the like) at that time; and
ii) polishing end point time, and a prediction output of the film thickness sensor, a predicted value of pressure against the semiconductor wafer 16 at that time, and iii) polishing end point time, a prediction output of the film thickness sensor, a predicted value of pressure against the semiconductor wafer 16, and a predicted distribution of the film thickness at that time (for example, the uniformity of the film thickness).

When the prediction output of the film thickness sensor, the predicted value of pressure against the semiconductor wafer 16, and the predicted distribution of the film thickness are known, the control section 65 can change/update the polishing conditions (polishing parameters), and optimize the control of the polishing conditions/improve the control accuracy of the polishing conditions. For example, the control section 65 changes the pressure against the semiconductor wafer 16, or change the rotation speed of the rotational table 30A. When the rotation speed is reduced and/or the pressure is reduced, the polishing speed is reduced, whereby the control section 65 can control the film thickness with respect to the target film thickness with high accuracy. Thus, the learning section 848 can output an arbitrary control parameter such as a pressure that is required by the control section 65. The control section 65 can change/update the polishing conditions for a semiconductor wafer 16 that is currently polished, the input data for the semiconductor wafer 16 being acquired by the learning section 84/the control section 65 can change/update the polishing conditions for a semiconductor wafer 16 that is to be polished in the next polishing step.

The learning section 848 may output the target value of the control parameter for preferred polishing in addition to the predicted value of the arbitrary control parameter such as a pressure at the polishing end point time. The polishing aims at obtaining good uniformity of the film thickness and the final film thickness with less error. The learning section 848 may output the target value of the arbitrary control parameter such as a pressure to further meet this target. The control section 65 can change/update the polishing conditions according to the target value to control the polishing conditions. The target value may vary with time.

The output of the learning section 848 is in the following various forms. i) The learning section 848 outputs a numerical value. For example, the learning section 848 outputs a predicted pressure in a numerical form. ii) The learning section 848 outputs a program. For example, the learning section 848 may output a program for calculating the temporal change in pressure when the pressure is output as a time variable. iii) The learning section 848 outputs a coefficient. For example, the learning section 848 outputs the coefficients of the calculation formula expressing the pressure as a time variable and the weighting factors of the neural network configuring the learning section 848. The learning section 848 can thus output a plurality of pieces of data and may output only one piece of data.

Note that as for the input to the learning section 848, the above-described plurality of pieces of data can be input. Alternatively, only one piece of data among these pieces of data may be input to the learning section 848. In the present embodiment, as a combination of the number of types of input data and the number of types of output data may be any of i) a combination of one type of input data and a plurality of types of output data, ii) a combination of a plurality of types of input data and a plurality of types of output data, and iii) a combination of a plurality of types of input data and one type of output data.

The learning section 848 can also output elements other than an arbitrary control parameter such as a pressure that is required by the control section 65. For example, the learning section 848 can output elements constituting the learning section 848 such as weighting factors of the neural network configuring the learning section 848. The learning section 848 can be improved by outputting the elements constituting the learning section 848.

Figure 11:
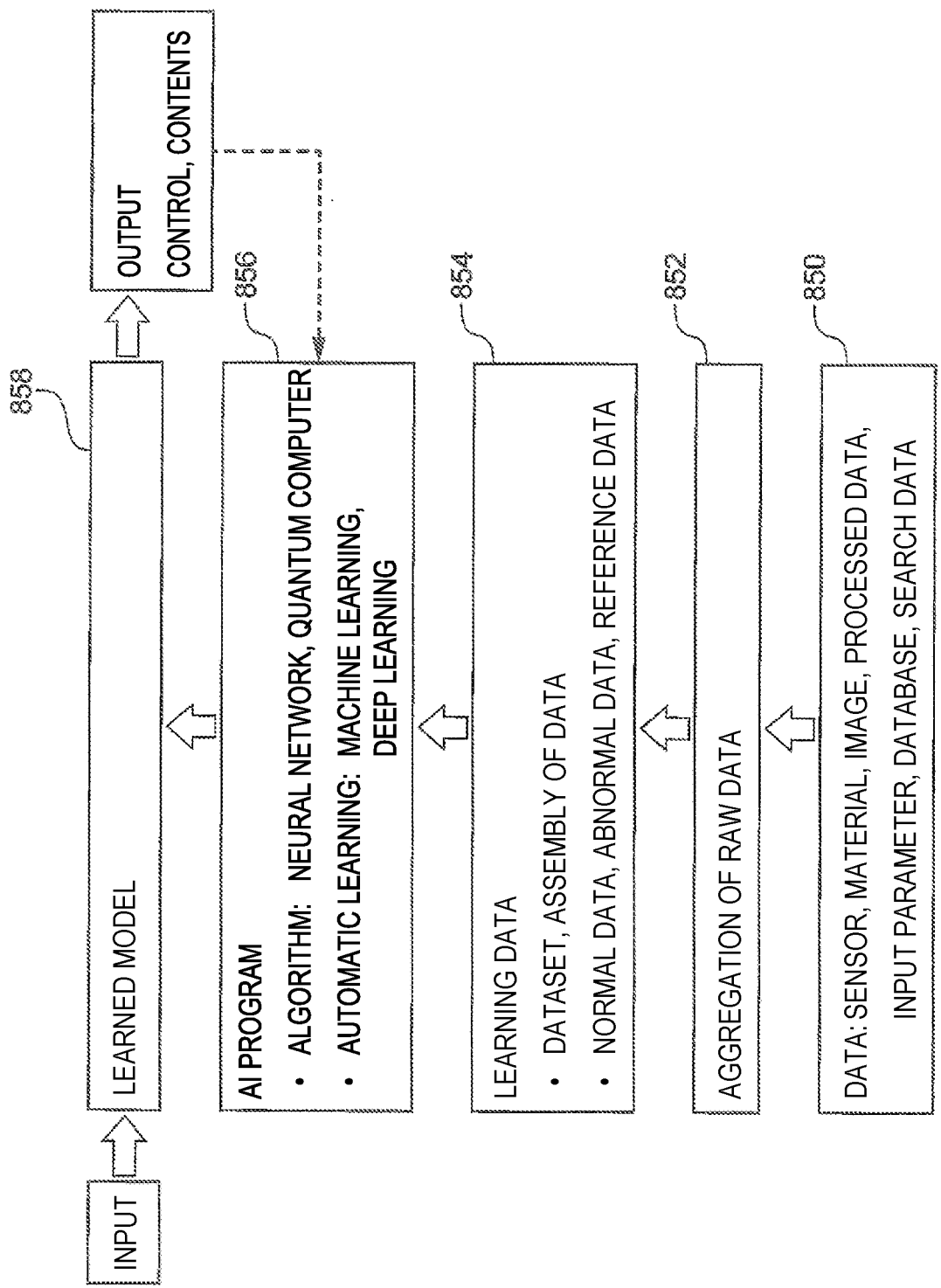
FIG. 11 is a diagram illustrating a usage example of data used for learning, algorithms, and a learned model.

Here, an outline of learning and the use of the model after learning will be described with reference to FIG. 11. FIG. 11 illustrates a usage example of the data used for learning, the algorithms, and the learned model. The data used for learning, that is, the type of input data 850 for the AI program can include i) data acquired from various sensors, ii) data on the materials of the semiconductor wafer 16 and the polishing pad 10, iii) image data obtained by converting sensor data into images, iv) processed data in which the sensor data is at least partially processed to be suitable for learning, v) an input parameter for polishing such as a control value to be input to the polishing unit 3A, vi) database created in the past for the data i) to v) or another database created for the polishing unit 3A, and vii) search data collected by a user.

When the input data 850 is collected and aggregation 852 of the input data 850 is obtained, the learning data 854 is created from the aggregation 852. The dataset which is the assembly of the input data 850 is created as the learning data 854. The dataset includes normal data obtained when the polishing is normal, abnormal data obtained when the polishing is abnormal, and reference data artificially created based on the user's determination made that the data is required for learning.

The learning data 854 is input to a computer program 856 for executing AI (artificial intelligence). The program 856 uses the neural network as algorithm and is executed by the computer. Furthermore, the program 856 may be executed using a quantum computer. The program 856 performs the automatic learning. More specifically, the program 856 performs the machine learning, and may perform deep learning as the machine learning. The learning data 854 is input to the program 856, and the output data to be output by the learning section 848 as described above is output.

After the program 856 performs the learning, the learned model 858 is used in the actual polishing step. In the actual polishing step, the learned model 858 receives the learning data 854 created from the data obtained in the actual polishing step, and outputs predetermined data designated by the user among the above-described output data. The output of the learned model 858 is used for control of the polishing unit 3A. The output of the learned model 858 is output as contents, and may be used for creation of the learning data 854. The created learning data 854 is input to the learned model 858 for learning, and the learning data 854 can be used for further learning.

The type of data constituting the learning data 854 for creating the learned model 858 may be the same as or different from the type of data to be input to the learned model 858 in the actual polishing step.

Thus, the learning section 848 has learned the relationship between the state variable and the change in the film thickness of the semiconductor wafer 16 through the neural network. Therefore, when the learning section 848 receives the state variable from the state acquisition section 846, the learning section 848 can predict the change in the film thickness, and/or can receive the state variable from the state acquisition section 846 and determine that the change is abnormal. The learning section 848 that has performed learning can receive the above-described state variable from the state acquisition section 846 and further learn the change in the film thickness.

In a state for creating the learning section 848 that has performed learning, the learning section 848 can receive the state variable from the state acquisition section 846 and learn the change in the film thickness, and/or can receive the state variable from the state acquisition section 846 and learn that the change in the film thickness is abnormal. In addition to this learning, the learning section 848 can also learn to obtain the above-described output. The data input to the learning section 848 in the state for creating the learning section 848 that has performed learning can be three patterns of only normal data, only abnormal data, and data including both of the normal data and the abnormal data.

Next, one embodiment of the end point detection section 28 and the machine learning method according to the present invention will be described with reference to FIG. 10. FIG. 10 is a block diagram illustrating an example of the end point detection section 28 according to one embodiment. In the following learning, the supervised learning will be described. The learned model 858 is created by learning described below. When the learned model 858 performs the following learning after the learned model 858 is created, the learned model 858 can be automatically updated. The learned model 858 can perform learning for automatic updating while predicting the change in film thickness in the polishing step.

Various methods can be employed for learning. In a first method, the data required for learning is input to the learning section 848 offline, that is, when the polishing is not performed, thereby causing the learning section 848 to learn the change in film thickness. The learning is repeated until the learning section 848 can predict the change in film thickness with high accuracy, and/or the learning section 848 can determine, with high accuracy, whether the change in film thickness is normal or abnormal.

In the first method, all of the data required for learning is input from the control section 65, as a signal 65c, to the learning section 848. Furthermore, all of the data required for learning may be directly input to the learning section 848 from an external computer of the substrate processing apparatus illustrated in FIG. 1 through the communication network without involving the control section 65. Furthermore, when the learning section 848 is configured with software, the external computer of the substrate processing apparatus illustrated in FIG. 1 may cause the learning section 848 to learn using the data required for learning, and then cause the end point detection section 28 of the polishing unit 3A to store the learning section 848 which is the learned software therein.

In the present embodiment, the data required for learning refers to a dataset created based on a combination of output 830a (film thickness) from the temperature sensor 832, the optical sensor 834, and the film thickness calculating section 830, output 65b from the control section 65, and determination data output from the determination data acquisition section 844. The signal 65b from the control section 65 refers to data transmitted, as the above-described signal 65b, to the state acquisition section 846. When the signal 65b contains a torque command value (and/or speed command value) for driving one or a plurality of motors, the torque command value (and/or speed command value) is an amount corresponding to the film thickness, and the film thickness is input, as 930a, from the film thickness calculating section 830. Therefore, the torque command value (and/or speed command value) need not be used for learning. The data required for learning can be obtained in the actual polishing step as in a second method described later. The data obtained in the polishing step can be accumulated to be used for learning. The data required for learning may be artificially created.

The second method is a method of learning during the actual polishing using the data during the actual polishing. The learning is repeated until the learning section 848 can predict the change in film thickness with high accuracy, and/or the learning section 848 can determine, with high accuracy, whether the change in film thickness is normal or abnormal. After the learning is finished, the learning section 848 that has performed learning predicts the change in film thickness or determines whether the change in film thickness is normal or abnormal.

In the second method, when the learning is performed, the determination information as to whether the learning data is normal data or abnormal data is input from the determination data acquisition section 844 to the learning section 848 in the end point detection section 28. The control section 65 transmits the determination information as the signal 65*d* to the determination data acquisition section 844 in response to an input operation by the user. Performing frequently the input operation by the user is unfavorable in view of cost. Therefore, after multiple sets of data during the actual polishing are stored in a memory in the learning section 848, the user may input, to the stored data, the determination information as to whether the learning data is normal data or abnormal data. Then, the learning section 848 may perform learning. Note that the first method and the second method may be used together. After the learning is performed, for example, the learning section 848 may receive the state variable from the state acquisition section 846 during the polishing step and further learn the change in film thickness, so that the learning section 848 is automatically updated.

The methods of creating the normal data when the polishing is normal and the abnormal data when the polishing is abnormal are as follows:
(i) A method using the database obtained in the past polishing step. For example, the data obtained in the past normal polishing step and the data obtained in the past abnormal polishing step are used.
(ii) A method using the database obtained currently or in the future when there is no database obtained in the past polishing step. The learning is continued while the current data and the subsequent data are stored, and the learned model is updated until the determination is made with high accuracy.

In the above-described first method (that is, offline learning), the method (i)/the methods (i) and (ii) can be adopted. In the above-described second method (that is, online learning), the method (ii)/the method (i) in the initial stage of the polishing step and the method (ii) in the subsequent stage can be adopted. The case where only the method (ii) is adopted corresponds to the case where new polishing step is performed because similar polishing step has not been performed in the past, for example.

The determination data acquisition section 844 is used for learning in the second method, but the determination data acquisition section 844 is not necessarily provided after the learning. The determination data acquisition section 844 is not necessarily provided for learning in the second method. This is because the determination data acquisition section 844 is unnecessary in the case where the learning section 848 learns only the change in film thickness and does not determine whether it is normal data or abnormal data.

After the learning section 848 learns the change in film thickness, the actual data on the change in film thickness is input to the learning section 848 that has performed learning for a period of time, whereby the learning section 848 can predict the change in film thickness in the subsequent period. Therefore, the learning section 848 that has performed learning predicts the change in film thickness, and the learning section 848 transmits the polishing end point time as a signal 65*e* to the control section 65.

The learning section 848 that has learned whether the change in film thickness is normal or abnormal transmits the determination result as to whether the change in film thickness is normal or abnormal, as the signal 65*e*, to the control section 65.

A learning method according to the second method will be described with reference to FIG. 10. The output 830*a* from the temperature sensor 832, the optical sensor 834, and the film thickness calculating section 830, and the output 65*b* from the control section 65 are input to the state acquisition section 846. That is, the state acquisition section 846 receives data such as a torque command value (and/or speed command value) for driving one or a plurality of motors, the torque command value (and/or speed command value) being output as the signal 65*b* from the control section 65 as described above, the output 830*a* from the film thickness calculating section 830, and the state variable (state amount) of the polishing unit 3A such as a temperature output from the temperature sensor 832 and the optical sensor 834. Note that the state acquisition section 846 may receive part, if not all, of the above-described state variables, and the state acquisition section 846 may receive additional state variables. Note that the learning method of the learning section 848 according to the first method is substantially the same as that according to the second method. That is, since the learning section 848 performs the learning using substantially the same dataset, the learning section 848 performs substantially the same learning.

Note that the learning section 848 may perform learning using different datasets between the first method and the second method. In the first method as the offline learning, the learning section 848 is easily affected by the parameters changing for a long time. In the second method as the online learning, preferably the learning section 848 can perform high-speed processing, and preferably the learning section 848 can perform learning using a small amount of data.

The learning section 848 learns the change in film thickness and whether the change in film thickness is normal or abnormal (that is, normal/abnormal in the polishing step) based on the dataset created based on a combination of the state variable output from the state acquisition section 846 and the determination data output from the determination data acquisition section 844. Here, the dataset refers to the data that associates the state variable and the determination data with one another. That is, generally, in the environment in which the polishing unit 3A is used, a large quantity of noise is produced in each of the control circuit and the measurement circuit, for example. Therefore, it is difficult to determine the change in film thickness and whether the polishing are normal or abnormal. In contrast, in the system of the present embodiment, the machine learning enables more accurate prediction of the change in film thickness and determination as to whether the polishing is normal or abnormal based on a feature of the effect of the state variable on the change in film thickness and the determination as to whether the polishing is normal or abnormal by separating the noise of the control circuit and the noise of the measurement circuit, for example.

Note that the end point detection section 28 may be connected to the polishing unit 3A through the network, for example, and be a digital computer which is separate from the polishing unit 3A. In another embodiment, the end point detection section 28 may be incorporated in the control section 65. In this case, the end point detection section 28 performs the machine learning using the processor of the control section 65. In still another embodiment, the end point detection section 28 may exist on the cloud server.

Figure 10:
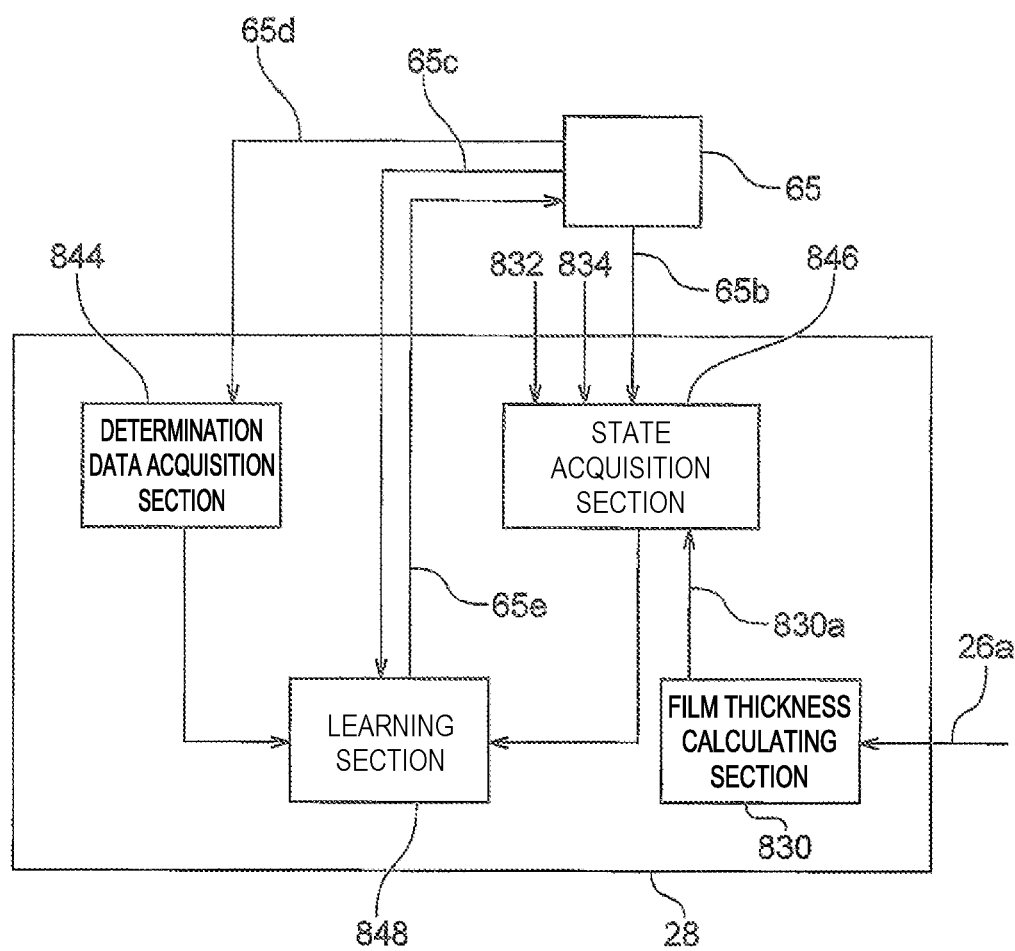
FIG. 10 is a block diagram illustrating an example of an end point detector according to one embodiment.
Figure 12:
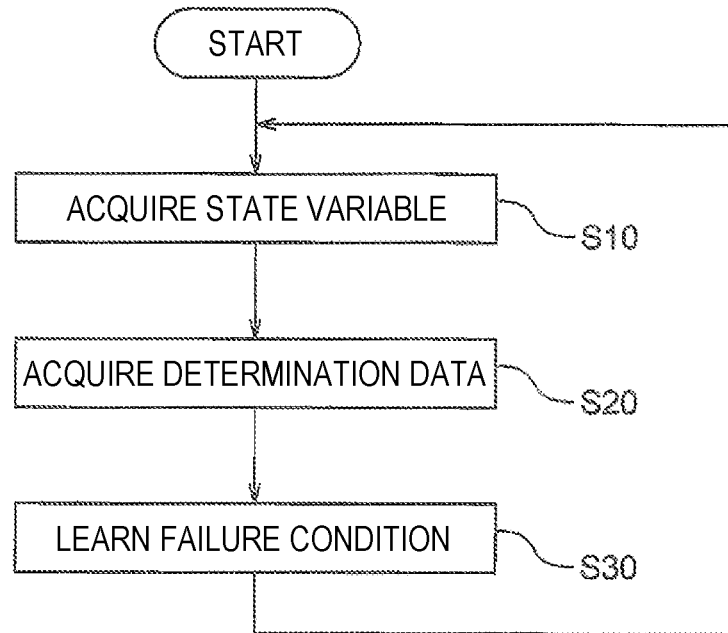
FIG. 12 is a flowchart for illustrating an example of learning processing in a machine learning apparatus in FIG. 10.

FIG. 12 is a flowchart for illustrating an example of learning processing in a machine learning apparatus in FIG. 10. As illustrated in FIG. 12, when the learning processing is started by the end point detection section 28, in step S10, the state acquisition section 846 acquires the state variables such as the torque command value and the pressure that are output from the control section 65, the film thickness that is output from the film thickness calculating section 830, and the temperature and the wear amount that are output from the temperature sensor 832 and the optical sensor 834, for example.

Furthermore, the process proceeds to step S20. The determination data acquisition section 844 acquires the determination data indicating the result of determination as to whether the film thickness data is normal or abnormal, as described above. Then, the process proceeds to step S30. The learning section 848 learns the change in film thickness and the determination as to whether the film thickness data are normal or abnormal according to the dataset created based on the combination of the state variable acquired in step S10 and the determination data acquired in step S20. Note that the learning section 848 may learn only one of the change in film thickness and the determination as to whether the film thickness data is normal or abnormal. When the learning section 848 learns only the change in film thickness, the determination data acquisition section 844 is not necessarily provided.

The processes in steps S10 to S30 are repeatedly performed until the end point detection section 28 sufficiently learns the change in film thickness and the determination as to whether the film thickness data is normal or abnormal. Here, the types and the number of sets of normal film thickness data and abnormal film thickness data are prepared as required for the learning section 848 to learn sufficiently. The ratio between the number of normal film thickness datasets and the number of abnormal film thickness datasets is 8:2, for example.

Figure 13:
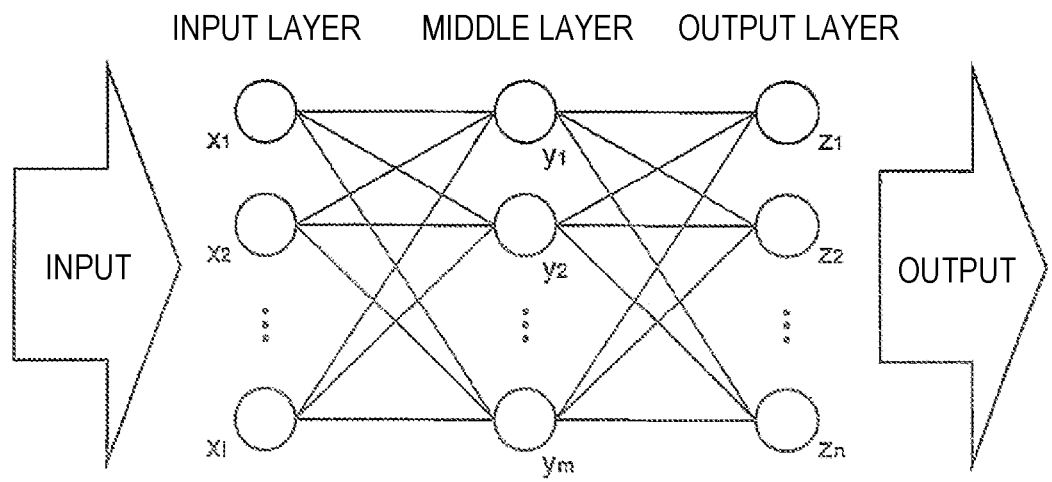
FIG. 13 is a diagram illustrating a configuration example of a neural network.

FIG. 13 is a diagram illustrating a configuration example of the neural network. The learning section 848 in the above-described end point detection section 28 may learn the failure prediction according to a neural network model, for example. As illustrated in FIG. 13, the neural network includes an input layer to which the state variable is input, the input layer containing "1" neurons (input nodes) x1, x2, x3, . . . , xl, a middle layer (hidden layer) connecting the input nodes and output nodes, the middle layer containing "m" neurons (hidden nodes) y1, y2, y3, . . . , ym, and an output layer from which an amount of feature is output, the output layer containing "n" neurons (output nodes) z1, z2, z3, . . . , zn. Note that the middle layer illustrated in FIG. 13 is one layer, but two or more middle layers may be formed. A general purpose computer or a processor may be used as the end point detection section 28 (neural net), but using GPGPU (General-Purpose computing on Graphics Processing Units), a large-scale PC cluster, and the like allow an increase in processing speed.

The learning section 848 may learn the failure prediction according to the machine learning (called as deep learning) using, for example, multilayer (four layers or more) neural network (deep neural network).

The neural network learns the change in film thickness of the polishing unit 3A and the determination as to whether the film thickness data is normal or abnormal. The neural network learns the relationship between the state variable and the change in film thickness and the determination as to whether the film thickness data is normal or abnormal, that is, the change in film thickness and the determination as to whether the film thickness data is normal or abnormal according to the dataset created based on a combination of the state variable acquired by the state acquisition section 846 and the determination data acquired by the determination data acquisition section 844, using so-called "supervised learning." Here, in the "supervised learning," a large amount of data pairs of an input and a result (label) are provided to a learning apparatus. The neural network learns features of the datasets, and obtains a model for predicting a result from an input, i.e., the relationship between an input and a result in a recursive manner.

The neural network can store only state variables while no abnormality has occurred, that is, while the polishing unit 3A is in normal operation, to learn the change in film thickness and the determination as to whether the film thickness data is normal or abnormal, by so-called "unsupervised learning." When, for example, the rate of occurrence of abnormality of the polishing unit 3A is very low, the technique using the "unsupervised learning" is effective. Here, in the "unsupervised learning," only a large amount of input data is provided to the end point detection section 28. The neural network learns the distribution of the input data and learns to apply compression, classification, alignment, and the like to the input data, without the end point detection section 28 being supplied with corresponding supervisory output data. The features of the dataset can be clustered and the like based on their similarity. With the use of this result, while providing a certain criterion, an output is assigned so as to optimize the criterion, and this allows the determination as to whether the film thickness data is normal or abnormal.

In the present embodiment, a recurrent neural network is used to model time-series data having temporal correspondence, the data indicating the change in film thickness. The recurrent neural network (RNN) forms a learning model not by exclusively using the state at the current time instant but also using the internal states at the previous time instants, together. Although a variety of recurrent neural networks are available, a simple recurrent network (Elman Network) will be described as an example below.

Figure 14A:
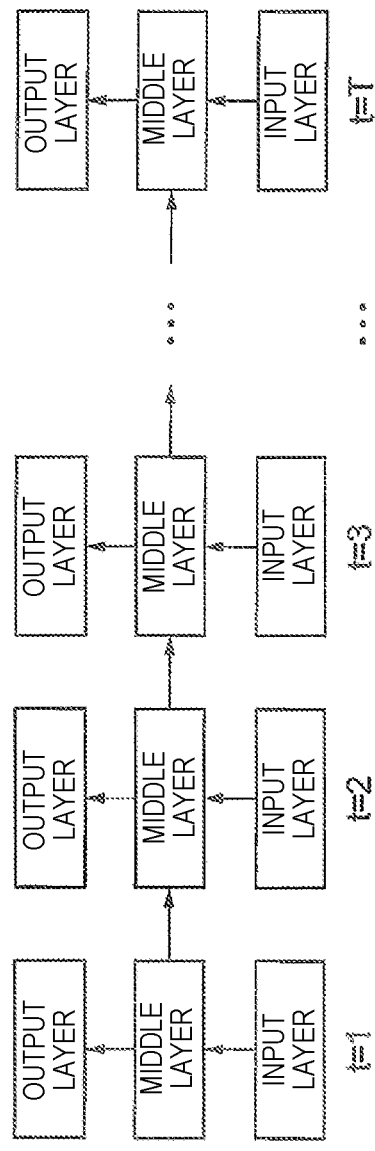
FIGS. 14A and 14B are diagrams for illustrating an example of a recurrent neural network.
Figure 14B:
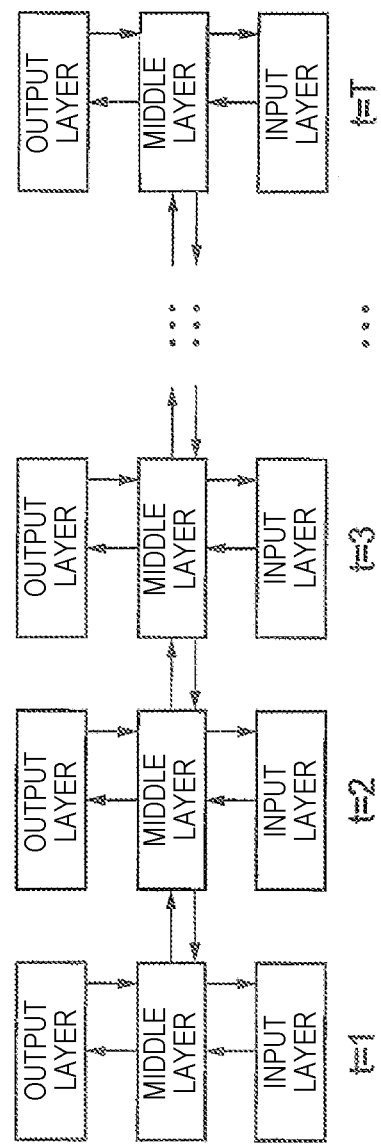

FIG. 14 is a diagram for illustrating an example of a recurrent neural network, in which FIG. 14A represents how Elman network extends along the time axis, and FIG. 14B represents the BPTT (Back Propagation Through Time) in the error backpropagation method. Here, backpropagation is applicable as long as an Elman network architecture, as illustrated in FIG. 14A, is used.

In the Elman network, unlike the normal neutral network, the error propagates backwards in time, as illustrated in FIG. 14B. Such backpropagation is called the BPTT (Back Propagation Through Time). The use of such a neutral network architecture allows estimation of a model for the output, based on the past input transition to predict, for example, the time of polishing end point. Other examples of the recurrent neural network include a method using LSTM (Long shortterm memory). The LSTM can process data of a longer span than the Elman network easily.

The learning section 848 may perform reinforcement learning. The reinforcement learning is one of the algorithms of machine learning. The reinforcement learning is not learning based on data clearly indicating whether the data is normal data like "supervised learning" and "unsupervised learning." In the reinforcement learning, the learning section 848 itself observes the current state, performs self-learning to optimize the control (this refers to as "the value is maximized or most rewards can be obtained" in the field of machine learning), and selects the control parameter. In the reinforcement learning, the learning section 848 itself updates evaluation regarding optimization.

As described above, after learning, the end point detection section 28 can detect the abnormality of polishing from the change in film thickness when the end point detection section 28 receives data on the film thickness and the like. Furthermore, the end point detection section 28 can predict the change in film thickness and output the polishing end point time when the end point detection section 28 receives data on the film thickness and the like during the polishing.

Figure 15A:
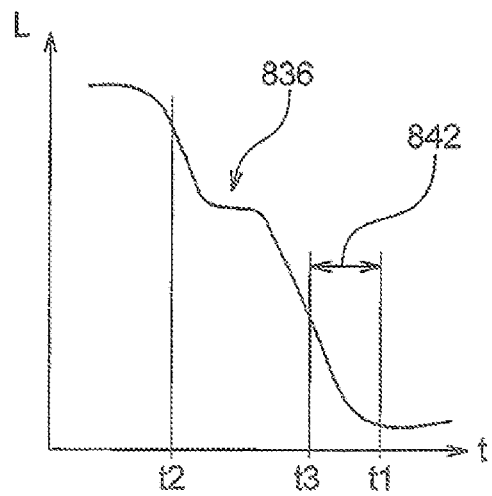
FIGS. 15A, 15B, 15C are graphs showing an example of normal change in film thickness.
Figure 15B:
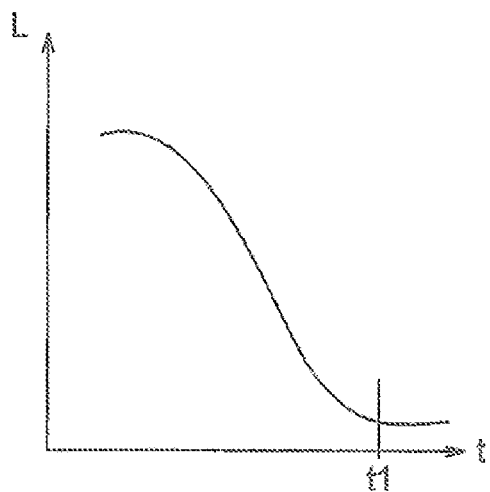
Figure 15C:
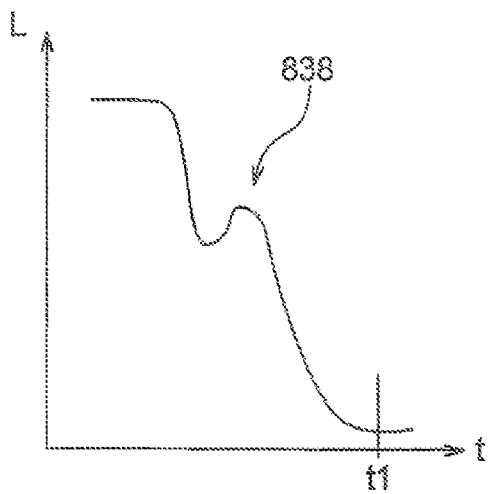
Figure 16:
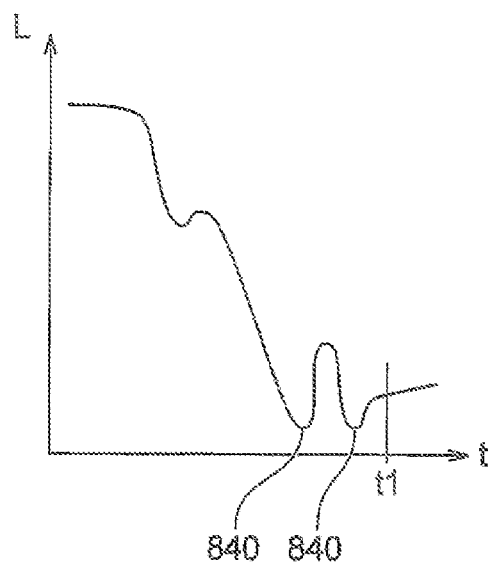
FIG. 16 is a graph showing an example of abnormal change in film thickness.

Here, FIG. 15 shows an example of normal change in film thickness. FIG. 16 shows an example of abnormal change in film thickness. The data shows examples in which the film thickness is obtained from the change in motor current. The horizontal axis of each of these graphs represents time (t) and the vertical axis represents the film thickness (μm). A time t1 is a polishing end point time. As shown in FIG. 15A, in the normal change in film thickness, a portion 836 where the change in film thickness is temporarily stopped may occur before the end of the polishing. As shown in FIG. 15C, in the normal change in film thickness, a portion 838 where the film thickness is temporarily increased may occur before the end of the polishing. Thus, when the conventional end point detection method is applied to obtain the film thickness from the change in motor current, such occurrence of the portion 836 where the change in film thickness is temporarily stopped and the portion 838 where the film thickness is temporarily increased before the end of the polishing may cause erroneous detection of the end point of the polishing. The end point detection section 28 that performs machine learning can determine that the change in film thickness shown in FIG. 15A and FIG. 15C is normal.

In FIG. 16, a portion 840 indicating the minimum value of the film thickness occurs twice in the vicinity of the end point of the polishing. In such a case, there is possibility that failure has occurred in a part of the device of the polishing unit 3A. The end point detection section 28 that performs machine learning can determine that the change in film thickness shown in FIG. 16 is abnormal.

The end point detection section 28 that performs machine learning can predict the polishing end point time. For example, in FIG. 15A, the end point detection section 28 can predict a time period 842 from a time t3 to the time t1, at the time t3 when the data on the film thicknesses from a time t2 to the time t3 and the like are input to the end point detection section 28. When end point detection section 28 predicts the time period 842 from the time t3 to the polishing end point time t1, the polishing parameter can be changed as follows in the polishing from the time t3 onward.

In the polishing from the time t3 onward, the pressure applied to the semiconductor wafer 16 is reduced, and the polishing speed with respect to the semiconductor wafer 16 is reduced, whereby the polishing end point time t1 and the film thickness at the end of the polishing can be controlled more accurately. To reduce the polishing speed, the rotation speed of the top ring 31A and/or the rotational table 30A can be switched during the polishing step to reduce the rotation speed. Reducing the polishing speed enables the polishing time to be extended, whereby the time for adjusting the pressure to be applied to each portion on the semiconductor wafer 16 can be increased. Furthermore, since the rotation speed can be increased by changing (reducing) the pressing force, the polishing accuracy can be improved by switching the pressing force and the rotation speed. Thus, the uniformity of the film thickness over the entire semiconductor wafer 16 can be improved.

Figure 17:
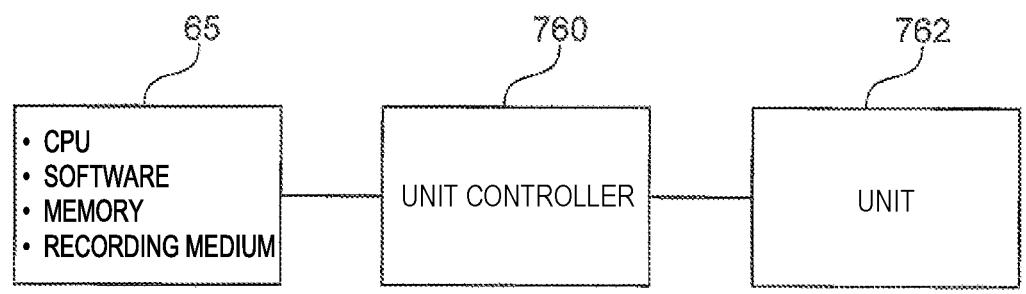
FIG. 17 is a diagram illustrating overall control by a control section.

Next, the control of the entire substrate processing apparatus by the control section 65 will be described with reference to FIG. 17. The control section 65 which is a min controller includes a CPU, a memory, a recording medium and software recorded in the recording medium or the like. The control section 65 performs monitoring or control of the entire substrate processing apparatus, exchanges signals therefor, records information or carries out calculations. The control section 65 exchanges signals mainly with a unit controller 760. The unit controller 760 also includes a CPU, a memory, a recording medium and software recorded in the recording medium or the like. In the case of FIG. 17, the control section 65 incorporates a program that functions as end point detection means for detecting a polishing end point indicating an end of polishing and control means for controlling the polishing by the polishing unit. Note that the unit controller 760 may incorporate a part or a whole of the program. The program is updatable. Note that the program may not be updatable.

Figure 18:
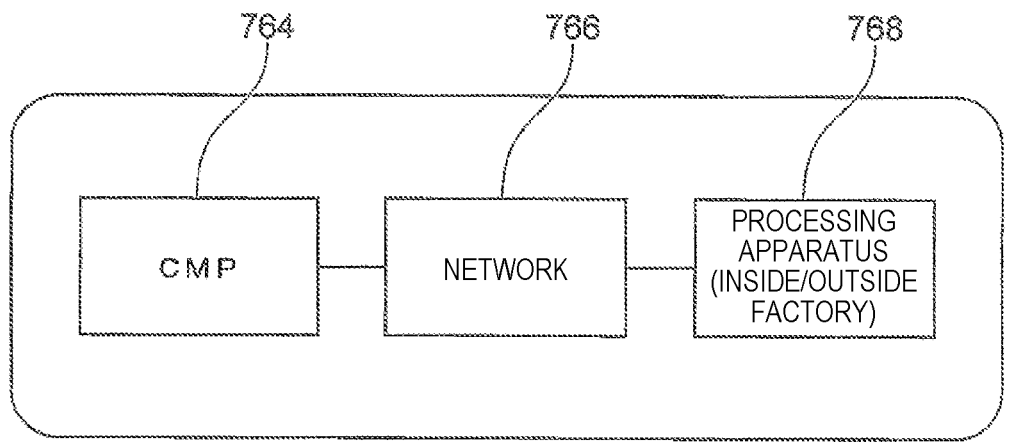
FIG. 18 is a diagram illustrating a configuration of another embodiment.
Figure 19:
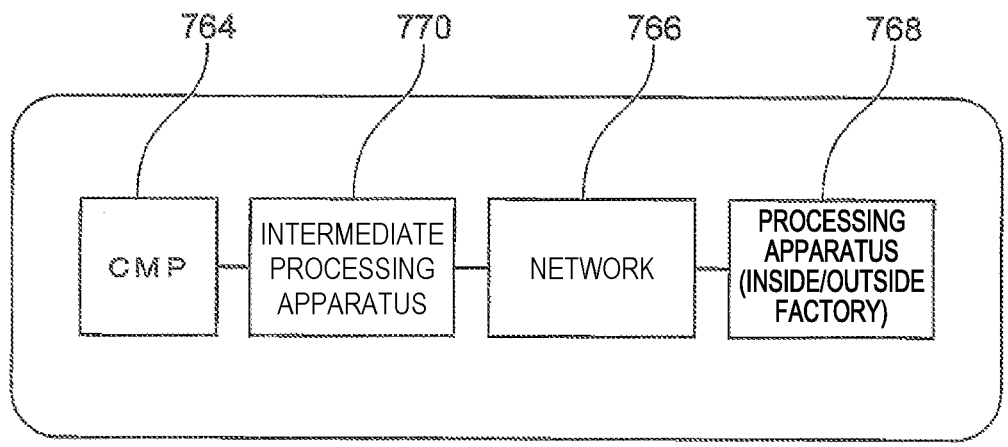
FIG. 19 is a diagram illustrating a modification of the embodiment in FIG. 18.

The embodiments described in FIG. 17 to FIG. 19 can solve the following problems. The control schemes of the polishing apparatus described so far have the following typical problems. Regarding end point detection, before polishing a target, a plurality of tests are conducted, polishing conditions or end point determination conditions are determined from the data obtained and a recipe which is the polishing conditions is created. A partial signal analysis may be used but processing of determining the end point detection is performed using one sensor signal for the semiconductor wafer structure. In this way, however, sufficient accuracy cannot be achieved to meet the following requirements. In order to improve yield of deices or chips to be manufactured, it is necessary to detect an end point with higher accuracy and minimize fluctuations among lots and chips in manufacturing the devices or chips. To meet such requirements, by using a system that carries out end point detection to which the embodiments described in FIG. 17 and subsequent figures are applied, it is possible to perform more accurate end point detection, improve yield and minimize fluctuations in the amount of polishing among chips.

Particularly, it is possible to achieve high-speed data processing, signal processing using many sensors of many types, data normalized from these signals, learning from data using artificial intelligence (AI), creation of a dataset used to determine end point detection, learning through storage of determination examples using the created dataset, improvement of accuracy using learning effects, polishing parameters determined and updated by the learned determination function, a high-speed communication processing system that reflects the polishing parameters in a high-speed control system, or the like. These are applicable to all the embodiments described in FIG. 15 and therebefore.

The unit controller 760 controls a unit 762 (one or in plurality) mounted on the substrate processing apparatus. According to the present embodiment, the unit controller 760 is provided for each unit 762. The load/unload section 62, the polishing section 63, and the cleaning section 64 and the like are provided as the unit 762. The unit controller 760 controls operation of the unit 762, exchanges signals with the monitoring sensor, exchanges control signals and performs high-speed signal processing or the like. The unit controller 760 is constructed of an FPGA (field-programmable gate array), an ASIC (application specific integrated circuit) or the like.

The unit 762 operates according to a signal from the unit controller 760. The unit 762 receives a sensor signal from the sensor and transmits the sensor signal to the unit controller 760. The sensor signal may be further transmitted from the unit controller 760 to the control section 65. The sensor signal is processed (including calculation processing) by the control section 65 or the unit controller 760 and a signal for the next operation is sent from the unit controller 760. The unit 762 operates according to the signal. For example, the unit controller 760 detects a torque fluctuation of the swing arm 110 from a current change in the swing shaft motor 14. The unit controller 760 sends a detection result to the control section 65. The control section 65 performs the end point detection.

Examples of the software include the following. The software determines the type of the polishing pad 10 and the amount of slurry supplied according to the data recorded in the control device (control section 65 or unit controller 760). Next, the software specifies maintenance timing of the polishing pad 10 or the polishing pad 10 usable until the maintenance timing, obtains the amount of slurry supplied and outputs the data. The software may also be software that can be installed in the substrate processing apparatus 764 after shipment of the substrate processing apparatus 764.

Communication among the control section 65, the unit controller 760, and the unit 762 can be carried out wiredly or wirelessly. Communication through the Internet or communication using other communication means (high-speed communication using a dedicated channel) is available for communication between the substrate processing apparatus 764 and the outside. Regarding data communication, it is possible to use a cloud through cloud cooperation and exchange data via smartphones in the substrate processing apparatus through smartphone cooperation. It is thereby possible to exchange an operation situation of the substrate processing apparatus and setting information of substrate processing with the outside of the substrate processing apparatus. A communication network may be formed between sensors as a communication device and this communication network may be used.

Automated operation of the substrate processing apparatus may be performed using the above-described control function and communication function. It is possible to standardize a control pattern of the substrate processing apparatus and use a threshold in determination of a polishing end point for automated operation.

It is possible to predict/determine/display an abnormality/life of the substrate processing apparatus. It is also possible to perform control to make performance more stable.

It is possible to automatically extract feature values of various types of data and polishing data (film thickness and end point of polishing) during operation of the substrate processing apparatus, automatically learn the operation state and polishing state, automatically standardize a control pattern and predict/determine/display an abnormality/life. The automatic learning means to automatically create a learned model and use the learned model to perform determination/analysis.

For a communication scheme, device interface or the like, it is possible to standardize, for example, a format, use it for information communication between apparatuses and devices to manage the apparatuses and devices.

Note that the end point detection section 28 having the learned model may be provided in the control section 65 or the unit controller 760. In FIG. 18 described later, the end point detection section 28 having the learned model may be provided in the substrate processing apparatus 764 or the data processing apparatus 768. In FIG. 19 described later, the end point detection section 28 having the learned model may be provided in the substrate processing apparatus 764 or the data processing apparatus 768 or an intermediate processing apparatus 770.

In FIGS. 18 and 19, edge computing can be performed in the substrate processing apparatus 764 or the intermediate processing apparatus 770 to perform high-speed processing. Furthermore, fog computing may be performed in the data processing apparatus 768 inside a factory to perform higher-speed processing than the processing using cloud.

Next, an embodiment will be described in which the substrate processing apparatus 764 acquires information from the semiconductor wafer 16 via a sensor, data is stored in a data processing apparatus (cloud or the like) installed inside/outside a factory in which the substrate processing apparatus is installed through communication means such as the Internet, the data stored in the cloud or the like is analyzed and the substrate processing apparatus is controlled according to the analysis result. FIG. 18 is a diagram illustrating a configuration of this embodiment.

1. The information acquired from the semiconductor wafer 16 via the sensor can be as follows:
   Measured signal or measured data relating to a torque fluctuation of the swing shaft motor 14
   Measured signal or measured data of an SOPM (optical sensor)
   Measured signal or measured data of an eddy current sensor
   Measured signal or measured data of one or a plurality of combinations 2. Communication means such as the Internet can have the following functions and configurations:
   Signals or data including the above-described measured signal or measured data are transmitted to the data processing apparatus 768 connected to the network 766.
   The network 766 can be communication means such as the Internet or high-speed communication. For example, it is possible to implement the network 766, in which the substrate processing apparatus, gateway, Internet, cloud, Internet, and data processing apparatus are connected in this order. Examples of high-speed communication include high-speed optical communication, high-speed radio communication, or the like. As high-speed radio communication, Wi-Fi (registered trademark), Bluetooth (registered trademark), Wi-Max (registered trademark), 3G, LTE or the like are conceivable. Other high-speed radio communications are also applicable. Note that a cloud may be used as the data processing apparatus.
   When the data processing apparatus 768 is installed in a factory, it is possible to process signals from one or a plurality of substrate processing apparatuses in the factory.
   When the data processing apparatus 768 is installed outside the factory, it is possible to transmit signals from one or a plurality of substrate processing apparatuses in the factory to the outside of the factory and process the signals. In this case, connections with data processing apparatuses installed in and outside Japan are possible.

3. Regarding the above description in which the data processing apparatus 768 analyzes data stored in the cloud or the like and controls the substrate processing apparatus 764 according to the analysis result, the following is possible:
   After the measured signal or measured data is processed, they can be transmitted to the substrate processing apparatus 764 as a control signal or control data.
   The substrate processing apparatus 764 that has received the data updates polishing parameters relating to polishing processing based on the data and performs polishing operation. When the data from the data processing apparatus 768 is a signal/data indicating that an end point is detected, polishing is completed by determining that an end point is detected. The polishing parameters include (1) pressing forces on four regions of the semiconductor wafer 16, that is, central portion, inside intermediate portion, outside intermediate portion and peripheral edge, (2) polishing time, (3) the number of revolutions of the rotational table 30A and the top ring 31A, and (4) a threshold for determination of a polishing end point.

Next, another embodiment will be described with reference to FIG. 19. FIG. 19 is a diagram illustrating a modification of the embodiment in FIG. 18. The present embodiment has a configuration with the substrate processing apparatus, the intermediate processing apparatus, the network 766, and the data processing apparatus connected in this order. The intermediate processing apparatus is constructed of, for example, an FPGA or ASIC, and has a filtering function, a calculation function, a data processing function and a dataset creation function.

Usage of the Internet and high-speed optical communication can be classified into the following three cases: (1) case where the substrate processing apparatus and the intermediate processing apparatus are connected through the Internet and the network 766 is the Internet; (2) case where the substrate processing apparatus and the intermediate processing apparatus are connected through high-speed optical communication and the network 766 is high-speed optical communication; (3) case where the substrate processing apparatus and the intermediate processing apparatus are connected through high-speed optical communication and the intermediate processing apparatus and outside thereof is the Internet.

Case (1): This is a case where the data communication speed and the data processing speed in the entire system can be a communication speed of the Internet. The data sampling speed is on the order of about 1 to 1000 mS and it is possible to carry out data communication of a plurality of polishing condition parameters. In this case, the intermediate processing apparatus 770 creates a dataset to be sent to the data processing apparatus 768. Details of the dataset will be described later. The data processing apparatus 768 that receives the dataset performs data processing, calculates changed values of polishing condition parameters up to the position of an end point, creates a polishing process plan and returns them to the intermediate processing apparatus 770 through the network 766. The intermediate processing apparatus 770 sends the changed values of the polishing condition parameters and necessary control signals to the substrate processing apparatus 764.

Case (2): Communication of sensor signals between the substrate processing apparatus and the intermediate processing apparatus and between the intermediate processing apparatus and the data processing apparatus, and communication between the state management devices correspond to high-speed communication. High-speed communication allows communication at a communication speed of 1 to 1000 Gbps. Data, datasets, commands and control signals or the like can be communicated in high-speed communication. In this case, the intermediate processing apparatus 770 creates a dataset and transmits the dataset to the data processing apparatus 768. The intermediate processing apparatus 770 extracts data necessary for processing in the data processing apparatus 768, processes the data and creates a dataset. For example, a plurality of sensor signals for end point detection are extracted to create a dataset.

The intermediate processing apparatus 770 sends the dataset created to the data processing apparatus 768 through high-speed communication. The data processing apparatus 768 calculates parameter changed values up to the polishing end point and creates a process plan based on the dataset. The data processing apparatus 768 receives datasets from a plurality of substrate processing apparatuses 764, calculates parameter updated values and creates a process plan in the next step for the respective apparatuses and transmits the updated datasets to the intermediate processing apparatus 770. The intermediate processing apparatus 770 converts the updated datasets to control signals based on the updated datasets and transmits the control signals to the control section 65 of the substrate processing apparatus 764 through high-speed communication. The substrate processing apparatus 764 applies polishing according to the updated control signals and performs accurate end point detection.

Case (3): The intermediate processing apparatus 770 receives a plurality of sensor signals of the substrate processing apparatus 764 through high-speed communication. High-speed optical communication allows communication at a communication speed of 1 to 1000 Gbps. In this case, on-line polishing condition control is possible through high-speed communication among the substrate processing apparatus 764, the sensor, the control section 65 and the intermediate processing apparatus 770. Data is processed in order of, for example, reception of a sensor signal (from the substrate processing apparatus 764 to the intermediate processing apparatus 770), creation of a dataset, data processing, calculation of a parameter updated value, transmission of updated parameter signals, polishing control by the control section 65 and detection of the updated end point.

In this case, the intermediate processing apparatus 770 performs high-speed end point detection control through high-speed communication. The intermediate processing apparatus 770 periodically transmits a status signal to the data processing apparatus 768, and the data processing apparatus 768 monitors a control state. The data processing apparatus 768 receives status signals from a plurality of substrate processing apparatuses 764 and creates a plan in the next process step for the respective substrate processing apparatuses 764. The data processing apparatus 768 sends a plan signal of the process step based on the plan to the respective substrate processing apparatuses 764 and the respective substrate processing apparatuses 764 prepare for and perform the polishing process independently of each other. In this way, the intermediate processing apparatus 770 performs high-speed end point detection control through high-speed communication and the data processing apparatus 768 manages states of the plurality of substrate processing apparatuses 764.

Next, examples of datasets will be described. A sensor signal and necessary control parameters can be formed into a dataset. The dataset can include a pressure of the top ring 31A on the semiconductor wafer 16, a current of the swing shaft motor 14, a motor current of the rotational table 30A, a measured signal of an optical sensor, a measured signal of an eddy current sensor, the position of the top ring 31A on the polishing pad 10, flow rates/types of slurry and a chemical liquid, correlation calculation data thereof or the like.

The above-described types of datasets can be transmitted using a transmission system whereby one-dimensional data is transmitted in parallel or a transmission system whereby one-dimensional data is transmitted sequentially. As for the dataset, the above-described one-dimensional data can be processed into two-dimensional data to form a dataset. For example, when it is assumed that the X-axis represents time and the Y-axis represents many data strings, a plurality of pieces of parameter data at the same time are processed into one data set. The two-dimensional data can be handled as something like two-dimensional image data. The merit is that a two-dimensional data transfer allows data associated with time to be exchanged and handled with a smaller amount of wiring than a one-dimensional data transfer. More specifically, when one-dimensional data is formed into one signal, one line as is, many wires are necessary, whereas in the case of a two-dimensional data transfer, a plurality of signals can be transmitted with one line. Furthermore, when a plurality of lines are used, the interface with the data processing apparatus 768 that receives transmitted data becomes complicated and data reassembly in the data processing apparatus 768 becomes complicated.

When such a time-associated two-dimensional dataset exists, comparisons with a dataset during polishing under a standard polishing condition performed previously and a dataset under a standard polishing condition currently being performed become easier. Furthermore, mutual differences between two-dimensional pieces of data can be easily known through difference processing or the like. It is also easy to extract differences and detect a sensor or a parameter signal in which an abnormality occurs. Furthermore, a dataset corresponding to a previous standard polishing condition is compared with a dataset currently being polished, and it is easier to detect an abnormality by extracting parameter signals in a region where a difference from surroundings differs.

Next, an example of a configuration for handling the information in the above-described first polishing unit 300A will be described with reference to FIG. 20 to FIG. 22. Note that the first polishing unit 300A is simply illustrated in FIG. 20 to FIG. 22, and a specific configuration (top ring 330A, polishing pad 310A, and the like) is omitted.

Figure 20:
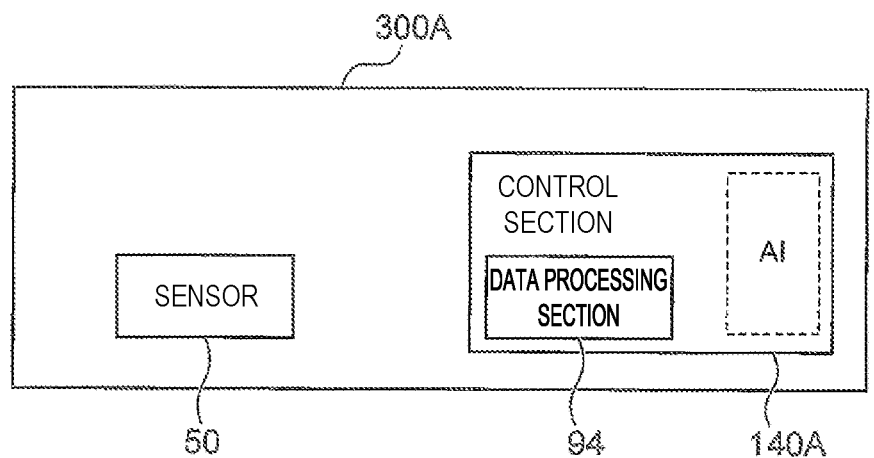
FIG. 20 is a block diagram illustrating control of a first polishing unit using AI.

FIG. 20 is a diagram illustrating an example of the first polishing unit 300A provided with a control section 140A including a data processing section 94. The data processing section 94 may be provided with an AI (Artificial Intelligence) function. The data processing section 94 may be any hardware, and may also be a program stored in a storage medium. In FIG. 20, the data processing section 94 is illustrated as an element which is independent of the other elements in the control section 140A, but the data processing section 94 may be stored in a storage device (not illustrated) included in the control section 140A and be controlled by a processor (not illustrated) of the control section 140A, for example. The data processing section 94 is configured to perform image processing and processing requiring large-scale computation, such as generation and acquisition of a polishing profile, update of a control parameter, and feedback of actual major signal as learning data. The configuration in FIG. 20 has the advantage that the first polishing unit 300A can be operated alone (stand alone).

Figure 21:
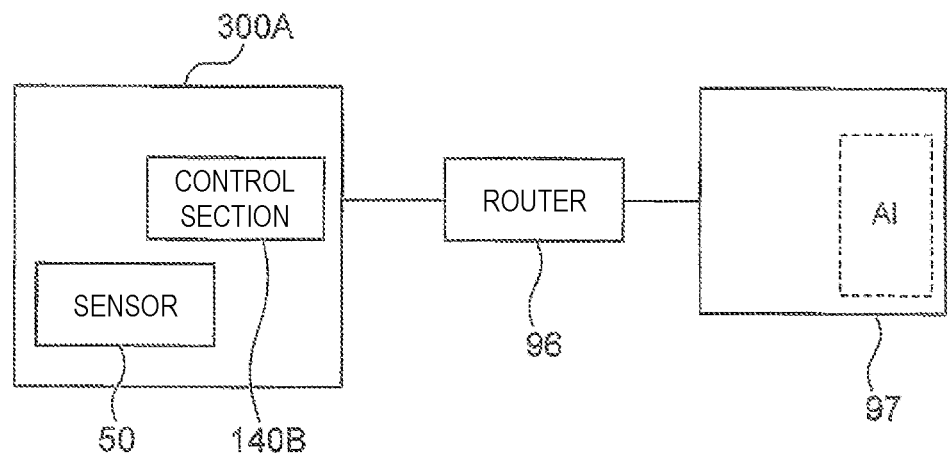
FIG. 21 is a block diagram illustrating control of a first polishing unit using AI.

FIG. 21 is a diagram illustrating an example of the first polishing unit 300A connected to the cloud (or fog) via a router 96. The router 96 is a device for connecting a control section 140B and a cloud 97. The router 96 can be referred to as a "device having a gateway function." The cloud 97 refers to a computer resource provided through the computer network such as the Internet. Note that in the case where the router 96 and the cloud 97 are connected through a local area network, the cloud may be referred to as a fog 97. For example, the cloud 97 is preferably used to connect a plurality of factories located at various locations on the earth with one another, and the fog 97 is preferably used to construct the network in a particular factory. The fog 97 may be connected to the outside fog or cloud. In FIG. 21, the control section 140 and the router 96 are connected wiredly, and the router 96 and the cloud (or fog) 97 are connected wiredly. However, each connection may be wireless connection. A plurality of first polishing units 300A are connected to the cloud 97 (not illustrated). Each of the plurality of first polishing units 300A is connected to the cloud 97 via the router 96. The data obtained by each of the first polishing units 300A (film thickness data from the eddy current sensor 50 or any other information) is integrated in the cloud 97. The cloud 97 in FIG. 21 may have an AI function, and data processing is implemented by the cloud 97. Note that a part of the processing may be implemented by the control section 140B. The configuration in FIG. 21 has the advantage that the first polishing units 300A can be controlled based on a large amount of data integrated in the cloud 97.

Figure 22:
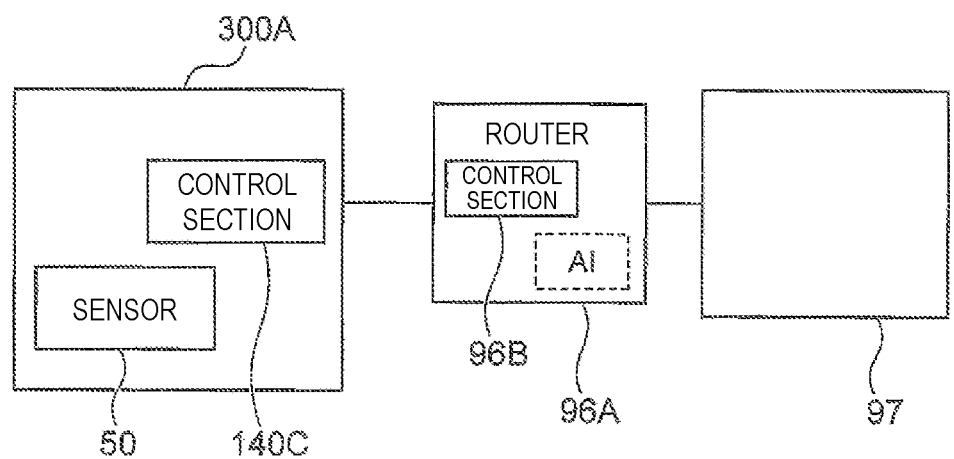
FIG. 22 is a block diagram illustrating control of a first polishing unit using AI.

FIG. 22 is a diagram illustrating an example of the first polishing unit 300A connected to the cloud (or fog) 97 via a router 96A having an edge computing function. The cloud 97 in FIG. 22 is also connected to the plurality of first polishing units 300A (not illustrated). Each of the plurality first polishing units 300A in FIG. 22 is connected to the cloud 97 via the router 96A. Note that some of routers need not have the edge computing function (some of routers may be the router 96 in FIG. 21). The router 96A includes a control section 96B. Note that, in FIG. 22, only one router 96A including the control section 96B is illustrated as a representative example. Furthermore, the router 96A may be provided with the AI function. The control section 96B and the AI function of the router 96A can process the data obtained from the control section 140C of the first polishing unit 300A near the first polishing unit 300A. As used herein, closeness is not a term meaning a physical distance but a term referring to a distance on the network. Note that as the distance on the network decreases, the physical distance also decreases in many cases. Therefore, when the computational speed in the router 96A is substantially the same as that in the cloud 97, the router 96A can perform higher-speed processing than the processing in cloud 97. Even when there is a difference in computational speed between both, the speed when the information transmitted from the control section 140C reaches the router 96A is faster than the speed when the information transmitted from the control section 140C reaches the cloud 97.

The router 96A in FIG. 22, more specifically, the control section 96B of the router 96A processes only data requiring high-speed processing among data to be processed. The control section 96B of the router 96A transmits the data not requiring high-speed processing to the cloud 97. The configuration in FIG. 22 has the advantage that both of the high-speed processing near the first polishing unit 300A and control based on the integrated data can be achieved.

Although the embodiments of the present invention have been described so far, the aforementioned embodiments are intended to facilitate an understanding of the present invention, but not intended to limit the present invention. The present invention can be changed or improved without departing from the spirit and scope of the present invention, and it goes without saying that the present invention includes its equivalent components. Furthermore, within a scope in which at least some of the aforementioned problems can be solved or within a scope in which at least some effects can be exerted, the scope of patent claims and the respective components described in the specification can be arbitrarily combined or omitted.

This application claims priority under the Paris Convention to Japanese Patent Application No. 2018-181352 filed on Sep. 27, 2018. The entire disclosure of Japanese Patent Laid-Open No. 2012-135865 including specification, claims, drawings and summary is incorporated herein by reference in its entirety.

REFERENCE SIGNS LIST

10 . . . Polishing pad
16 . . . Semiconductor wafer
28 . . . End point detection section
3A . . . First polishing unit
50 . . . Eddy current sensor
51 . . . Determination data acquisition section
52 . . . State acquisition section
53 . . . Learning section
63 . . . Polishing section
30A . . . Rotational table
31A . . . Top ring
33A . . . Dresser
676 . . . Optical sensor
760 . . . Unit controller
764 . . . Substrate processing apparatus
766 . . . Network
768 . . . Data processing apparatus
770 . . . Intermediate processing apparatus
830 . . . Film thickness calculating section
832 . . . Temperature sensor
834 . . . Optical sensor

What is claimed is:

1. A polishing apparatus capable of polishing a target, the polishing apparatus comprising:
a state acquisition section capable of acquiring a state variable including at least data on a state of the target of data on a state of a device making up the polishing apparatus and the data on the state of the target; and
a learning section that has learned a relationship between the state variable and a change in film thickness of the target using a neural network, the learning section being capable of receiving the state variable from the state acquisition section to predict the change and/or receiving the state variable from the state acquisition section to determine that the change is abnormal,
wherein the data on the state of a device making up the polishing apparatus includes at least one of data on the arrangement of the device, data on an operation state of the device, and data on the state of exhaustion of the device,
the data on a state of the target includes at least one of data detected by a film thickness detection section capable of detecting a film thickness of the target, data detected by a temperature detection section capable of detecting a temperature of the target, data detected by a pressure detection section capable of detecting a pressure applied to the target, and data on characteristics of the target, and
the data detected by the film thickness detection section includes at least one of (i) table torque applied to a rotational table capable of rotating a polishing pad to polish the target, (ii) arm torque applied to an arm holding a top ring capable of holding the target, (iii) a current value of a first electric motor for driving to rotate the rotational table, (iv) a current value of a second electric motor for driving to rotate the top ring, (v) a current value of a third electric motor for swinging the arm.

2. The polishing apparatus according to claim 1, wherein the data on the arrangement of the device includes at least one of data on the position of the top ring capable of holding the target, data on the position of the rotational table capable of rotating the polishing pad to polish the target, data on the position of the arm holding the top ring, and data on the position of the dresser capable of performing dressing the polishing pad,
the data on the operation state of the device includes at least one of data on the number of revolutions of the top ring, and data on the number of revolutions of the rotational table,
the data on a state of exhaustion of the device includes at least one of data on a use time of a consumable part included in the polishing apparatus, and data on a consumed amount of the consumable part, and
the data on characteristics of the target includes at least one of data on a material of the target, and data on a film thickness and a circuit pattern on the target before being polished by the polishing apparatus.

3. The polishing apparatus according to claim 1, further comprising:
a determination data acquisition section that acquires determination data indicating presence or absence of abnormality or degree of abnormality of the polishing apparatus,
wherein the learning section learns a change in film thickness of the target based on a dataset created based on a combination of the state variable and the determination data.

4. The polishing apparatus according to claim 1, wherein the learning section receives the state variable from the state acquisition section to learn the change.

5. A polishing method causing a computer to execute:
a state acquiring step of acquiring a state variable including at least data on a state of the target of data on a state of a device making up the polishing apparatus and the data on the state of the target; and
an estimating step of causing a learning section that has learned a relationship between the state variable and a change in film thickness of the target using a neural network to receive the acquired state variable to predict the change and/or to receive the acquired state variable to determine that the change is abnormal,
wherein the data on the state of a device making up the polishing apparatus includes at least one of data on the arrangement of the device, data on an operation state of the device, and data on the state of exhaustion of the device,
the data on a state of the target includes at least one of data detected by a film thickness detection section capable of detecting a film thickness of the target, data detected by a temperature detection section capable of detecting a temperature of the target, data detected by a pressure detection section capable of detecting a pressure applied to the target, and data on characteristics of the target, and
the data detected by the film thickness detection section includes at least one of (i) table torque applied to a rotational table capable of rotating a polishing pad to polish the target, (ii) arm torque applied to an arm holding a top ring capable of holding the target, (iii) a current value of a first electric motor for driving to rotate the rotational table, (iv) a current value of a second electric motor for driving to rotate the top ring, (v) a current value of a third electric motor for swinging the arm.

6. A machine learning apparatus capable of learning a change in film thickness of a target to be polished by a polishing apparatus, the machine learning apparatus comprising:
a state acquisition section capable of acquiring a state variable including at least data on a state of the target of data on a state of a device making up the polishing apparatus and the data on the state of the target; and a learning section that has learned a relationship between the state variable and a change in film thickness of the target using a neural network, the learning section being capable of receiving the state variable from the state acquisition section to predict the change and/or receiving the state variable from the state acquisition section to determine that the change is abnormal, wherein the data on the state of a device making up the polishing apparatus includes at least one of data on the arrangement of the device, data on an operation state of the device, and data on the state of exhaustion of the device, the data on a state of the target includes at least one of data detected by a film thickness detection section capable of detecting a film thickness of the target, data detected by a temperature detection section capable of detecting a temperature of the target, data detected by a pressure detection section capable of detecting a pressure applied to the target, and data on characteristics of the target, and the data detected by the film thickness detection section includes at least one of (i) table torque applied to a rotational table capable of rotating a polishing pad to polish the target, (ii) arm torque applied to an arm holding a top ring capable of holding the target, (iii) a current value of a first electric motor for driving to rotate the rotational table, (iv) a current value of a second electric motor for driving to rotate the top ring, (v) a current value of a third electric motor for swinging the arm.

7. A machine learning apparatus capable of learning a change in film thickness of a target to be polished by a polishing apparatus, the machine learning apparatus comprising:

a state acquisition section capable of acquiring a state variable including at least data on a state of the target of data on a state of a device making up the polishing apparatus and the data on the state of the target; and a learning section capable of learning a relationship between the state variable and a change in film thickness of the target using a neural network, and receiving the state variable from the state acquisition section to predict the change and/or receiving the state variable from the state acquisition section to determine that the change is abnormal, wherein the data on the state of a device making up the polishing apparatus includes at least one of data on the arrangement of the device, data on an operation state of the device, and data on the state of exhaustion of the device, the data on a state of the target includes at least one of data detected by a film thickness detection section capable of detecting a film thickness of the target, data detected by a temperature detection section capable of detecting a temperature of the target, data detected by a pressure detection section capable of detecting a pressure applied to the target, and data on characteristics of the target, and the data detected by the film thickness detection section includes at least one of (i) table torque applied to a rotational table capable of rotating a polishing pad to polish the target, (ii) arm torque applied to an arm holding a top ring capable of holding the target, (iii) a current value of a first electric motor for driving to rotate the rotational table, (iv) a current value of a second electric motor for driving to rotate the top ring, (v) a current value of a third electric motor for swinging the arm.

* * * * *